US012604570B2

(12) United States Patent
Im et al.

(10) Patent No.: US 12,604,570 B2
(45) Date of Patent: Apr. 14, 2026

(54) LIGHT-EMITTING DEVICE AND DISPLAY DEVICE HAVING SAME

(71) Applicant: Samsung Display Co., Ltd., Yongin-si (KR)

(72) Inventors: Hyun Deok Im, Yongin-si (KR); Jong Hyuk Kang, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 720 days.

(21) Appl. No.: 17/295,403

(22) PCT Filed: May 20, 2019

(86) PCT No.: PCT/KR2019/006027
§ 371 (c)(1),
(2) Date: May 19, 2021

(87) PCT Pub. No.: WO2020/105824
PCT Pub. Date: May 28, 2020

(65) Prior Publication Data
US 2022/0005978 A1     Jan. 6, 2022

(30) Foreign Application Priority Data

Nov. 21, 2018    (KR) ........................ 10-2018-0144853

(51) Int. Cl.
*H10H 20/831*          (2025.01)
*H10H 20/819*          (2025.01)
                     (Continued)

(52) U.S. Cl.
CPC ...... *H10H 20/8316* (2025.01); *H10H 20/819* (2025.01); *H10H 20/835* (2025.01); *H10H 20/857* (2025.01); *H10H 29/142* (2025.01)

(58) Field of Classification Search
CPC ............ H10H 20/8316; H10H 20/819; H10H 20/835; H10H 20/857; H10H 29/142;
                     (Continued)

(56) References Cited

U.S. PATENT DOCUMENTS 7,727,788 B2     6/2010  Han et al.
9,059,114 B2     6/2015  Do et al.
                     (Continued)

FOREIGN PATENT DOCUMENTS

CN       108074961 A     5/2018
CN       108364575 A     8/2018
                     (Continued)

OTHER PUBLICATIONS

International Search Report for corresponding Application No. PCT/KR2019/006027 dated Aug. 27, 2019, 4 pages with English Translation.

*Primary Examiner* — Su C Kim
(74) *Attorney, Agent, or Firm* — Womble Bond Dickinson (US) LLP

(57)          ABSTRACT
A light emitting device may include: an emission area; an insulating pattern in the emission area, the insulating pattern including at least one recess and a protrusion around the recess; a first electrode on the insulating pattern and overlapping a first area of the recess and the protrusion in a periphery of the first area; a second electrode on the insulating pattern and spaced from the first electrode in a first direction, the second electrode overlapping a second area of the recess and the protrusion in a periphery of the second area; and a light emitting diode in the recess and electrically connected between the first electrode and the second electrode.

19 Claims, 25 Drawing Sheets

(51) Int. Cl.
    *H10H 20/832*     (2025.01)
    *H10H 20/857*     (2025.01)
    *H10H 29/14*     (2025.01)

(58) Field of Classification Search
    CPC .... H10H 20/856; H10H 29/30; H10H 20/831;
                    H10H 29/49; H01L 25/0753
    See application file for complete search history.

(56)             References Cited

U.S. PATENT DOCUMENTS

| | | | |
|---|---|---|---|
| 9,773,761 B2 | 9/2017 | Do | |
| 10,199,449 B2 | 2/2019 | Kim et al. | |
| 10,461,123 B2 | 10/2019 | Kim et al. | |
| 10,672,946 B2 | 6/2020 | Cho et al. | |
| 10,872,945 B2 | 12/2020 | Choi | |
| 2003/0189830 A1 | 10/2003 | Sugimoto et al. | |
| 2010/0165601 A1 | 7/2010 | Yoon et al. | |
| 2014/0159064 A1* | 6/2014 | Sakariya | H01L 25/167 |
| | | | 257/88 |
| 2017/0170200 A1 | 6/2017 | Ikeda et al. | |
| 2017/0179092 A1* | 6/2017 | Sasaki | H01L 25/167 |
| 2017/0294451 A1 | 10/2017 | Kim et al. | |
| 2018/0175106 A1 | 6/2018 | Kim et al. | |

FOREIGN PATENT DOCUMENTS

| | | | |
|---|---|---|---|
| JP | 2006-066531 A | 3/2006 | |
| KR | 10-0763894 B1 | 10/2007 | |
| KR | 10-1209449 B1 | 12/2012 | |
| KR | 10-1490758 B1 | 2/2015 | |
| KR | 10-2017-0104086 A | 9/2017 | |
| KR | 10-2018-0007376 A | 1/2018 | |
| KR | 10-2018-0072909 A | 7/2018 | |
| KR | 10-2018-0081378 A | 7/2018 | |

* cited by examiner

LIGHT-EMITTING DEVICE AND DISPLAY DEVICE HAVING SAME

CROSS-REFERENCE TO RELATED APPLICATIONS

This application is a U.S. National Phase Patent Application of International Patent Application Number PCT/KR2019/006027, filed on May 20, 2019, which claims priority to Korean Patent Application No. 10-2018-0144853, filed Nov. 21, 2018. The entire contents of both of which are incorporated herein by reference.

BACKGROUND

1. Field

Various embodiments of the present disclosure relate to a light emitting device and a display device including the light emitting device.

2. Description of Related Art

Recently, a technique of manufacturing a subminiature light emitting diode using a material having a reliable inorganic crystal structure and manufacturing a light emitting device using the light emitting diode has been developed. For example, a technique of manufacturing subminiature light emitting diodes having a small size corresponding to a range from the nanoscale to the microscale, and forming a light source of a light emitting device using the subminiature light emitting diodes has been developed. Such a light emitting device may be provided in various electronic devices such as a display device and a lighting device.

SUMMARY

Various embodiments of the present disclosure are directed to a light emitting device including a light emitting diode, and a display device including the light emitting device.

A light emitting device in accordance with an embodiment of the present disclosure may include: an emission area; an insulating pattern in the emission area, the insulating pattern including at least one recess and a protrusion around the recess; a first electrode on the insulating pattern and overlapping a first area of the recess and the protrusion in a periphery of the first area; a second electrode on the insulating pattern and spaced from the first electrode in a first direction, the second electrode overlapping a second area of the recess and the protrusion in a periphery of the second area; and a light emitting diode in the recess and electrically connected between the first electrode and the second electrode.

In an embodiment, the recess may include, in a perimeter area thereof adjacent to the protrusion, an inclined surface having an inclination within an angular range.

In an embodiment, each of the first electrode and the second electrode may include a bent portion having a bent shape on each of an upper end and a lower end of the inclined surface.

In an embodiment, the recess may have a circular shape, an elliptical shape, a polygonal shape, or a combination thereof, in a plan view.

In an embodiment, the recess may include an opening.

In an embodiment, the recess may have a width greater than a length of the light emitting diode in the first direction.

In an embodiment, the recess may have an identical width in the first direction and a second direction perpendicular to the first direction.

In an embodiment, the light emitting diode may include a rod-type light emitting diode including a first end and a second end on opposite ends thereof in a longitudinal direction.

In an embodiment, the light emitting device may further include: a first contact electrode on the first end of the light emitting diode and one area of the first electrode to electrically connect the first end to the first electrode; and a second contact electrode on the second end of the light emitting diode and one area of the second electrode to electrically connect the second end to the second electrode.

In an embodiment, the light emitting device may further include a first insulating layer interposed between the light emitting diode and the first electrode and the second electrode, and exposing the one area of each of the first electrode or the second electrode.

In an embodiment, the light emitting device may further include a reflective electrode on the first insulating layer adjacent to the light emitting diode, and including an opening corresponding to the light emitting diode.

In an embodiment, each of the first electrode and the second electrode may extend in a second direction intersecting with the first direction, and the reflective electrode may include at least one first directional pattern extending in the first direction and crossing the first electrode and the second electrode.

In an embodiment, the insulating pattern may include a plurality of recesses located at intervals. At least one light emitting diode may be in each of the plurality of recesses.

A display device in accordance with an embodiment of the present disclosure may include: a display area; and a pixel in the display area and including an emission area. The pixel may include: an insulating pattern in the emission area, the insulating pattern including at least one recess, and a protrusion around the recess; a first electrode on the insulating pattern and overlapping a first area of the recess and the protrusion in a periphery of the first area; a second electrode on the insulating pattern and spaced from the first electrode in a first direction, the second electrode overlapping a second area of the recess and the protrusion in a periphery of the second area; and a light emitting diode in the recess and electrically connected between the first electrode and the second electrode.

In an embodiment, the recess may include, in a perimeter area thereof adjacent to the protrusion, an inclined surface having an inclination within an angular range. Each of the first electrode and the second electrode may include a bent portion having a bent shape on each of an upper end and a lower end of the inclined surface.

In an embodiment, the recess may have a circular shape, an elliptical shape, a polygonal shape, or a combination thereof, in a plan view.

In an embodiment, the recess may include an opening.

In an embodiment, the recess may have a width greater than a length of the light emitting diode in the first direction.

In an embodiment, the pixel may include at least one of: a first insulating layer interposed between the light emitting diode and the first electrode and the second electrode, and including an opening formed to expose one area of each of the first electrode or the second electrode; and a reflective electrode on the first insulating layer adjacent to the light emitting diode, and including an opening corresponding to the light emitting diode.

In an embodiment, the insulating pattern may include a plurality of recesses located at intervals in the emission area. At least one light emitting diode may be in each of the plurality recesses.

In a light emitting device and a display device including the light emitting device in accordance with various embodiments of the present disclosure, the efficiency of light emitted from each emission area may be enhanced, and the degree of alignment of light emitting diodes may be enhanced.

BRIEF DESCRIPTION OF THE DRAWINGS

FIGS. 5A-5C each are a circuit diagram illustrating a light emitting device in accordance with an embodiment of the present disclosure, and for example illustrate different embodiments of an active pixel including the light emitting device.

FIG. 10 is a sectional view illustrating a light emitting device in accordance with an embodiment of the present disclosure, and for example, illustrates an embodiment of a cross-section corresponding to the line III-III' of FIG. 6B.

DETAILED DESCRIPTION

Figure 1A:
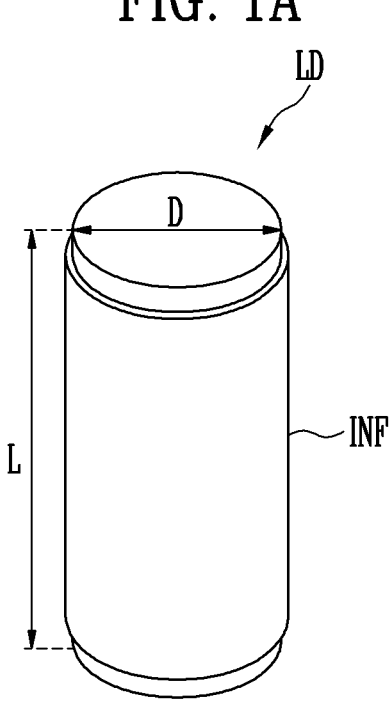
FIGS. 1A and 1B are respectively a perspective view and a sectional view illustrating a light emitting diode in accordance with an embodiment of the present disclosure.

Reference will now be made in detail to various embodiments of the present disclosure, specific examples of which are illustrated in the accompanying drawings and described below, because the embodiments of the present disclosure can be variously modified in many different forms. However, the present disclosure is not limited to the following embodiments and may be modified in various forms.

Some elements which are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation may not be repeated.

It will be understood that, although the terms "first", "second", etc. may be used herein to describe various elements, these elements should not be limited by these terms. It will be further understood that the terms "comprise", "include", "have", etc. when used in the present disclosure, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the term "position", "direction", etc. used in the following description are defined in relative terms, and it should be noted that they may be changed into a reverse position or direction depending on a view angle or direction.

Embodiments and required details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural from as long as it is not specifically mentioned in a sentence.

FIGS. 1A, 1B, 2A, 2B, 3A, and 3B are perspective diagrams and sectional diagrams illustrating light emitting diodes LD in accordance with embodiments of the present disclosure. Although FIGS. 1A to 3B illustrate cylindrical rod-type light emitting diodes LD, the type and/or shape of the light emitting diode LD in accordance with the present disclosure is not limited thereto.

Figure 1B:
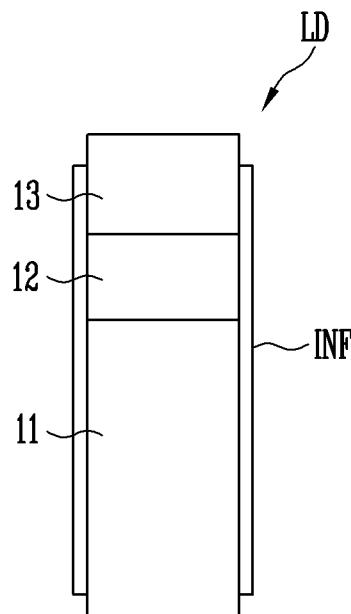

Referring to FIGS. 1A and 1B, a light emitting diode LD in accordance with an embodiment of the present disclosure may include a first conductivity type semiconductor layer 11 (also referred to as a "first semiconductor layer"), a second conductivity type semiconductor layer 13 (also referred to as a "second semiconductor layer"), and an active layer 12 interposed between the first and second conductivity type semiconductor layers 11 and 13. For example, the light emitting diode LD may be configured of a stacked body formed by successively stacking the first conductivity type semiconductor layer 11, the active layer 12, and the second conductivity type semiconductor layer 13.

In an embodiment, the light emitting diode LD may be provided in the form of a rod extending in one direction. If the direction in which the light emitting diode LD extends is defined as a longitudinal direction, the light emitting diode LD may have a first end and a second end with respect to the longitudinal direction.

In an embodiment, one of the first and second conductivity type semiconductor layers 11 and 13 may be disposed on the first end of the light emitting diode LD, and the other one of the first and second conductivity type semiconductor layers 11 and 13 may be disposed on the second end of the light emitting diode LD.

In an embodiment, the light emitting diode LD may be a rod-type light emitting diode manufactured in the form of a rod. In the present disclosure, the term "rod-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, a length L of the light emitting diode LD may be greater than a diameter D thereof (or a width of the cross-section thereof).

In an embodiment, the light emitting diode LD may have a small size corresponding to a range from the nanoscale size to the microscale, e.g., a diameter D and/or a length L ranging from the nanoscale to the microscale. However, in the present disclosure, the size of the light emitting diode LD is not limited thereto. For example, the size of the light emitting diode LD may be changed in various ways depending on design conditions of various devices, e.g., display devices, each of which employs, as a light source, a light emitting device using a light emitting diode LD.

The first conductivity type semiconductor layer 11 may include, for example, at least one n-type semiconductor layer. For instance, the first conductivity type semiconductor layer 11 may include an n-type semiconductor layer which includes any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited to this, and the first conductivity type semiconductor layer 11 may be formed of various other materials.

The active layer 12 may be disposed on the first conductivity type semiconductor layer 11 and have a single or multiple quantum well structure. In an embodiment, a cladding layer doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field corresponding to a voltage (e.g., a set or predetermined voltage or more) is applied between the opposite ends of the light emitting diode LD, the light emitting diode LD emits light by combination of electron-hole pairs in the active layer 12. Because light emission of the light emitting diode LD can be controlled based on the foregoing principle, the light emitting diode LD may be used as a light source of various light emitting devices as well as a pixel of a display device.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes any one semiconductor material of InAlGaN, GaN, AlGaN, InGaN, AlN, and InN, and is doped with a second conductive dopant such as Mg. However, the material for forming the second conductivity type semiconductor layer 13 is not limited to this, and the second conductivity type semiconductor layer 13 may be formed of various other materials.

In an embodiment, the light emitting diode LD may further include an insulating film INF provided on the surface (e.g., an outer peripheral surface) of the light emitting diode LD. In an embodiment, the insulating film INF may be formed on the surface of the light emitting diode LD to enclose an outer surface (e.g., an outer peripheral surface) of at least the active layer 12. In an embodiment, the insulating film INF may further enclose an area of each of the first and second conductivity type semiconductor layers 11 and 13. Here, the insulating film INF may allow the opposite ends of the light emitting diode LD that have different polarities to be exposed to the outside. For example, the insulating film INF may expose one end of each of the first and second conductivity type semiconductor layers 11 and 13 that are disposed on the respective opposite ends of the light emitting diode LD with respect to the longitudinal direction, e.g., the insulating film INF may expose two bottom surfaces of the cylinder (in FIGS. 1A and 1B, the top and bottom surfaces of the light emitting diode LD) rather than covering the two bottom surfaces.

In an embodiment, the insulating film INF may include at least one insulating material of $SiO_2$, $Si_3N_4$, $Al_2O_3$, and $TiO_2$, but it is not limited thereto. In other words, the material that forms the insulating film INF is not limited to a particular material, and the insulating film INF may be formed of well-known various insulating materials.

In an embodiment, the light emitting diode LD may further include additional components as well as the first conductivity type semiconductor layer 11, the active layer 12, the second conductivity type semiconductor layer 13, and/or the insulating film INF. For example, the light emitting diode LD may further include at least one fluorescent layer, at least one active layer, at least one semiconductor layer and/or at least one electrode layer disposed on one end of the first conductivity type semiconductor layer 11, the active layer 12, and/or the second conductivity type semiconductor layer 13.

Figure 2A:
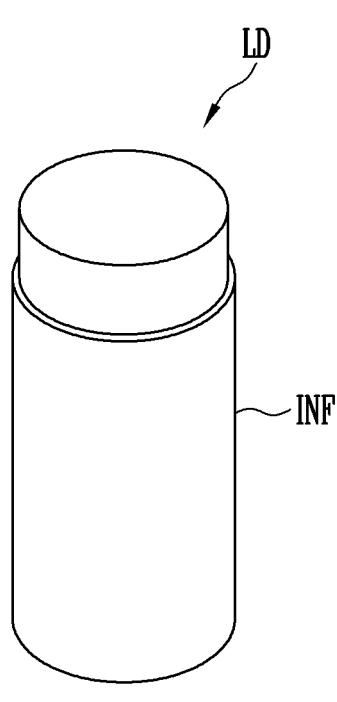
FIGS. 2A and 2B are respectively a perspective view and a sectional view illustrating a light emitting diode in accordance with an embodiment of the present disclosure.
Figure 2B:
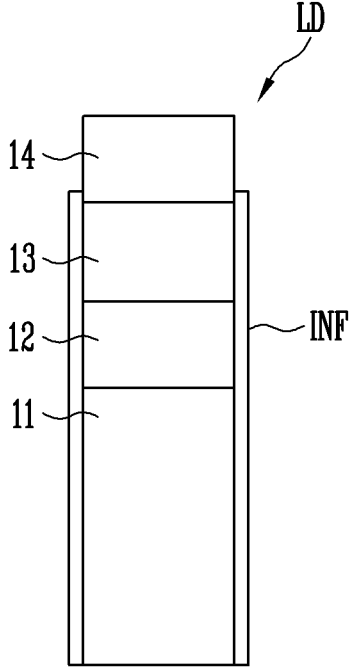
Figure 3A:
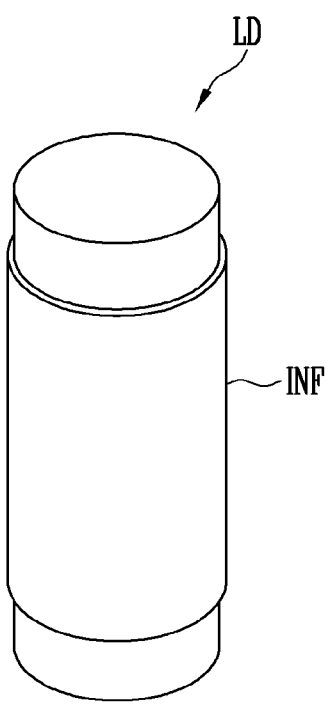
FIGS. 3A and 3B are respectively a perspective view and a sectional view illustrating a light emitting diode in accordance with an embodiment of the present disclosure.
Figure 3B:
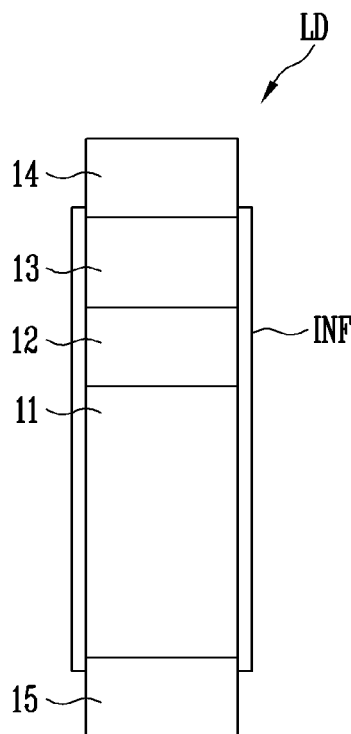

For example, as shown in FIGS. 2A and 2B, the light emitting diode LD may further include at least one electrode layer 14 disposed on one end of the second conductivity type semiconductor layer 13. In an embodiment, as shown in FIGS. 3A and 3B, the light emitting diode LD may further include at least one electrode layer 15 disposed on one end of the first conductivity type semiconductor layer 11.

Each of the electrode layers 14 and 15 may be an ohmic contact electrode, but it is not limited thereto. Furthermore, each of the electrode layers 14 and 15 may include metal or a metal oxide. For example, Cr, Ti, Al, Au, Ni, an oxide or alloy thereof, and ITO, IZO, ITZO may be used alone or in combination with each other. In an embodiment, the electrode layers 14 and 15 may be substantially transparent or translucent. Thereby, light generated from the light emitting diode LD may be emitted out of the light emitting diode LD after passing through the electrode layers 14 and 15.

In an embodiment, the insulating film INF may at least partially enclose outer surfaces (e.g., outer peripheral surfaces) of the electrode layers 14 and 15, or may not enclose the outer surfaces (e.g., outer peripheral surfaces). In other words, the insulating film INF may be selectively formed on the surfaces of the electrode layers 14 and 15. Furthermore, the insulating film INF may be formed to allow the opposite ends of the light emitting diode LD having different polarities to be exposed, for example, the insulating film INF may allow at least one area of each of the electrode layers 14 and 15 to be exposed. Alternatively, in an embodiment, the insulating film INF may not be provided.

If the insulating film INF is provided on the surface of the light emitting diode LD, for example, on the surface (e.g., the outer peripheral surface) of the active layer 12, the active layer 12 may be prevented or protected from short-circuiting with at least one electrode (e.g., at least one contact electrode of contact electrodes connected to the opposite ends of the light emitting diode LD). Consequently, the electrical stability of the light emitting diode LD may be secured.

Furthermore, because of the insulating film INF formed on the surface of the light emitting diode LD, occurrence of a defect on the surface of the light emitting diode LD may be reduced or minimized, whereby the lifetime and efficiency of the light emitting diode LD may be improved. In some embodiments, if the insulating film INF is formed on each light emitting diode LD, even when a plurality of light emitting diodes LD are disposed adjacent to each other, the light emitting diodes LD may be prevented from undesirably short-circuiting.

In an embodiment of the present disclosure, the light emitting diode LD may be fabricated through a surface treatment process. For example, each light emitting diode LD may be surface-treated so that, when a plurality of light emitting diodes LD are mixed with a fluidic solution and then supplied to each emission area (e.g., an emission area of each pixel), the light emitting diodes LD can be evenly dispersed rather than unevenly aggregating in the solution. For example, the surfaces of the light emitting diodes LD may be coated with a material (e.g., a set or predetermined material).

The light emitting device including the above-described light emitting diode LD may be used in various devices including a display device which requires a light source. For instance, at least one subminiature light emitting diode LD, e.g., a plurality of subminiature light emitting diodes LD each having a size ranging from the nanoscale to the microscale, may be disposed in each pixel area of a display panel so as to form a light source (or, a light source unit) of the corresponding pixel. Furthermore, the field of application of the light emitting diode LD according to the present disclosure is not limited to a display device. For example, the light emitting diode LD may also be used in various devices such as a lighting device, which requires a light source.

Figure 4:
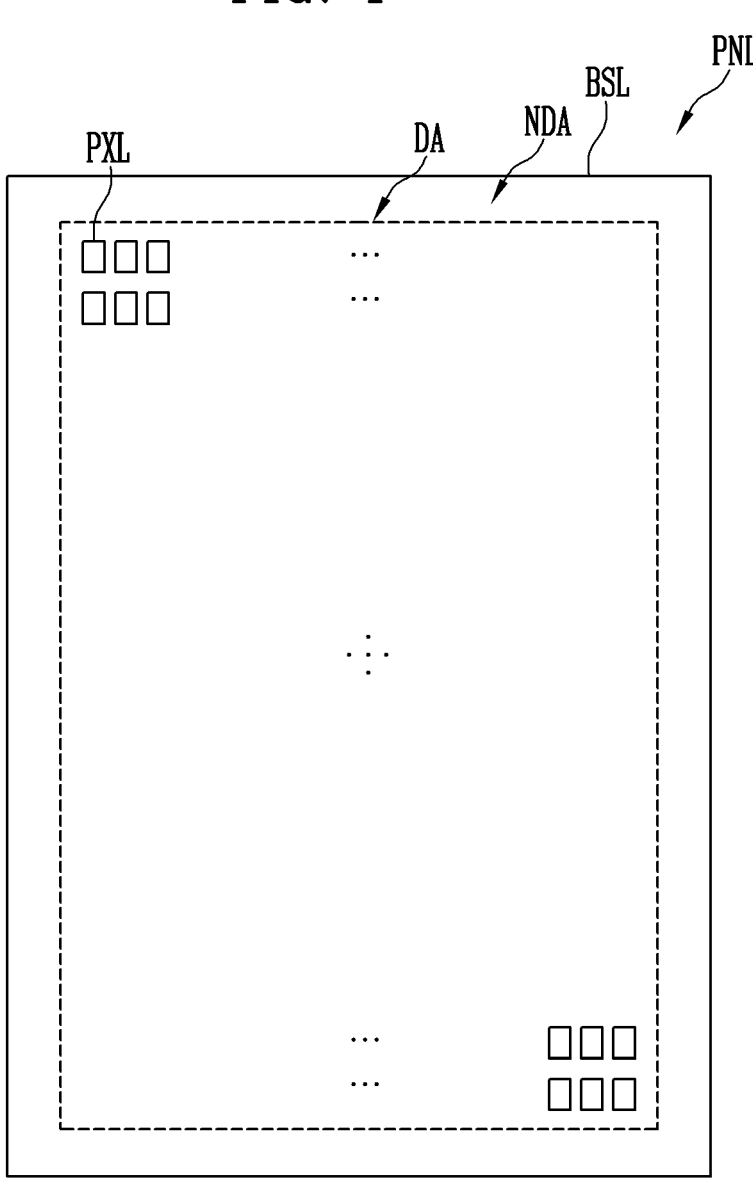
FIG. 4 is a plan view illustrating a display device in accordance with an embodiment of the present disclosure.

FIG. 4 is a plan view illustrating a display device in accordance with an embodiment of the present disclosure. In an embodiment, FIG. 4 illustrates a display device, for example, a display panel PNL provided in the display device, as an example of a device which may use, as a light source, the light emitting diode LD described with reference to FIGS. 1A-3B. For example, pixels PXL of the display panel PNL each may include a light emitting device. The light emitting device may include at least one light emitting diode LD.

For the sake of explanation, FIG. 4 simply illustrates the structure of the display panel PNL in accordance with an embodiment, focused on a display area DA. In some embodiments, although not illustrated, at least one driving circuit (e.g., at least one of a scan driver and a data driver) and/or a plurality of lines may be further provided on the display panel PNL.

Referring to FIG. 4, the display panel PNL in accordance with an embodiment of the present disclosure may include a base layer BSL, and a plurality of pixels PXL disposed on the base layer BSL. In some embodiments, the display panel PNL and the base layer BSL for forming the display panel PNL may include a display area DA for displaying an image, and a non-display area NDA formed in an area (e.g., a set or predetermined area) other than the display area DA. For example, the non-display area NDA may surround the display area DA along the edge or periphery of the display area DA. The pixels PXL may be disposed in the display area DA on the base layer BSL.

In an embodiment, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited to this, and the locations thereof may be changed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the present disclosure is not limited thereto. For instance, the base layer BSL may be a transparent, translucent, opaque, or reflective base.

One area on the base layer BSL is defined as the display area DA in which the pixels PXL are disposed, and the other area thereof is defined as the non-display area NDA. For example, the base layer BSL may include the display area DA including a plurality of pixel areas in which the respective pixels PXL are formed, and the non-display area NDA disposed around the display area DA along the edge or periphery of the display area. Various lines and/or internal circuits which are connected to the pixels PXL of the display area DA may be disposed in the non-display area NDA.

In an embodiment, the pixels PXL may be distributed and arranged in the display area DA. In an embodiment, the pixels PXL may be arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. For example, the pixels PXL may be arranged in the display area DA in various known arrangement manner.

Each pixel PXL may include at least one light source, which is driven by a control signal (e.g., a set or predetermined control signal (e.g., a scan signal and a data signal)) and/or power voltage (e.g., first and second power voltage), for example, a light emitting diode LD according to any one of the embodiments of FIGS. 1A-3B. For example, each pixel PXL may include at least one light emitting diode LD having a small size ranging from the nanoscale to the microscale. For example, each pixel PXL may include a plurality of rod-type light emitting diodes which are connected in parallel between pixel electrodes and/or power lines. The plurality of rod-type light emitting diodes may form a light emitting device of each pixel PXL (e.g., a light source or a light source unit of each pixel PXL).

In an embodiment, each pixel PXL may be formed of an active pixel. However, the types, structures, and/or driving schemes of the pixels PXL capable of being applied to the display device according to the present disclosure are not particularly limited. For example, each pixel PXL may have the same structure or substantially the same structure as that of a pixel of various well-known passive or active light emitting display devices.

Figure 5A:
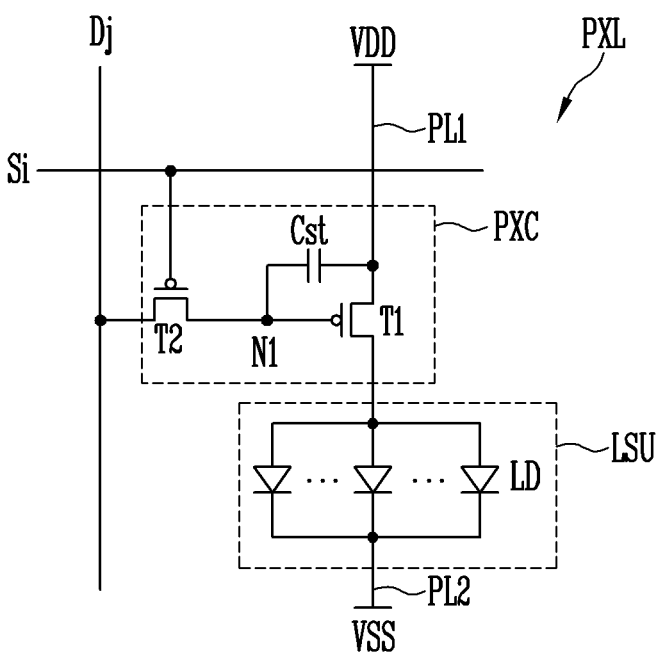
Figure 5B:
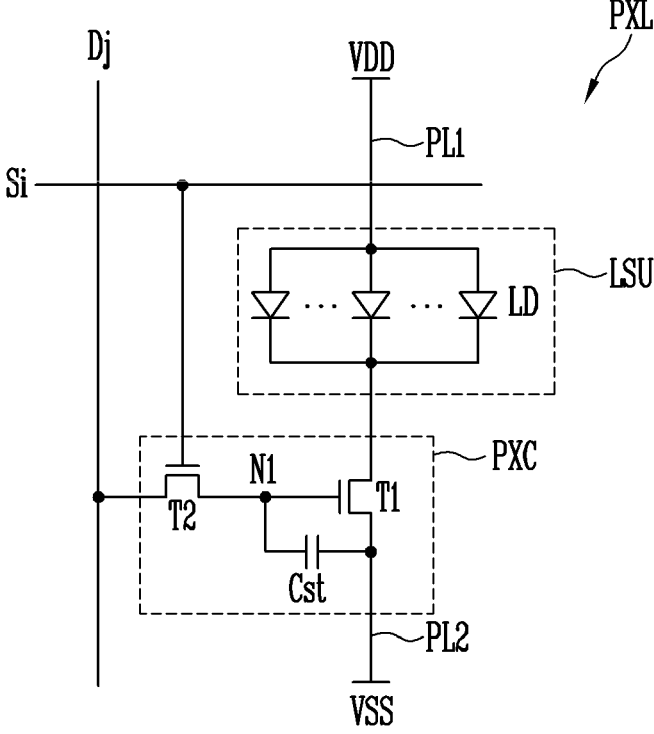
Figure 5C:
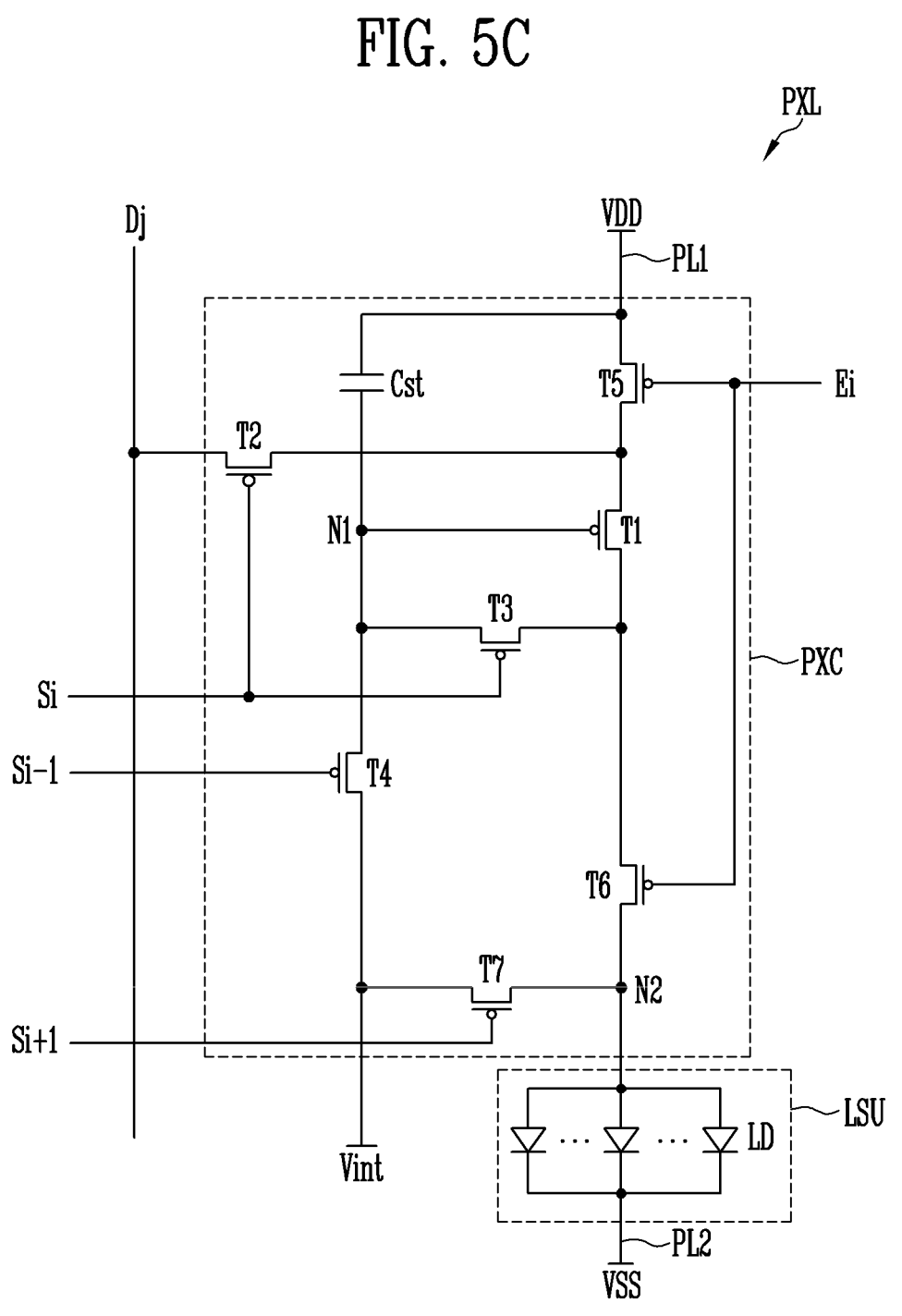

FIGS. 5A-5C are circuit diagrams illustrating a light emitting device in accordance with an embodiment of the present disclosure, and for example illustrate different embodiments of an active pixel PXL including the light emitting device. In an embodiment, each pixel PXL illustrated in FIGS. 5A-5C may be any one of the pixels PXL provided on the display panel PNL of FIG. 4. The pixels PXL may have substantially the same or similar structure.

Referring to FIG. 5A, the pixel PXL in accordance with an embodiment of the present disclosure may include a light source unit LSU configured to generate light having a luminance corresponding to a data signal, and a pixel circuit PXC configured to drive the light source unit LSU. The light source unit LSU may form a light emitting device in accordance with an embodiment of the present disclosure.

In an embodiment, the light source unit LSU may include a plurality of light emitting diodes LD electrically connected between a first power supply VDD and a second power supply VSS. In an embodiment, the light emitting diodes LD may be connected in parallel to each other, but the present disclosure is not limited thereto. For example, in an embodiment, a plurality of light emitting diodes LD may be connected in a serial/parallel combined structure between the first power supply VDD and the second power supply VSS.

In an embodiment, the first and second power supplies VDD and VSS may have different potentials to make it possible for the light emitting diodes LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting diodes LD or more during at least a light emitting period of the pixel PXL.

Although FIG. 5A illustrates an embodiment in which the light emitting diodes LD forming the light source unit LSU of each pixel PXL are connected in parallel to each other in the same direction (e.g., in a forward direction) between the first power supply VDD and the second power supply VSS, the present disclosure is not limited to this. For example, in an embodiment, some of the light emitting diodes LD may be connected to each other in a first direction (e.g., the forward direction) between the first and second power supplies VDD and VSS, and the other light emitting diodes LD may be connected to each other in a second direction (e.g., a reverse direction). Alternatively, in an embodiment, at least one pixel PXL may include only a single light emitting diode LD (e.g., a single valid light emitting diode connected in the forward direction between the first and second power supplies VDD and VSS).

In an embodiment, first ends of the light emitting diodes LD forming each light source unit LSU may be connected in common to the pixel circuit PXC through a first electrode of the light source unit LSU (also referred to as a "first pixel electrode" or a "first alignment electrode"), and may be connected to the first power supply VDD through the pixel circuit PXC and a first power line PL1. Second ends of the light emitting diodes LD may be connected in common to the second power supply VSS through a second electrode of the light source unit LSU (also referred to as a "second pixel electrode" or a "second alignment electrode") and a second power line PL2.

Each light source unit LSU may emit light having a luminance corresponding to driving current supplied thereto through the corresponding pixel circuit PXC. Thereby, an image (e.g., a set or predetermined image) may be displayed in the display area DA.

The pixel circuit PXC may be connected to a scan line Si and a data line Dj of the corresponding pixel PXL. For example, if the pixel PXL is disposed on an i-th row (i is a natural number) and a j-th column (j is a natural number) of the display area DA, the pixel circuit PXC of the pixel PXL may be connected to an i-th scan line Si and a j-th data line Dj of the display area DA. In an embodiment, the pixel circuit PXC may include first and second transistors T1 and T2, and a storage capacitor Cst.

The first transistor (also referred to as a "driving transistor") T1 is connected between the first power supply VDD and the first electrode of the light source unit LSU. A gate electrode of the first transistor T1 is connected to a first node N1. The first transistor T1 may control driving current to be supplied to the light source unit LSU in response to a voltage of the first node N1.

The second transistor (also referred to as a "switching transistor") T2 may be connected between the data line Dj and the first node N1. A gate electrode of the second transistor T2 is connected to the scan line Si. When a scan signal of a gate-on voltage (e.g., a low level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2. Thereby, a voltage corresponding to the data signal is charged to the storage capacitor Cst (e.g., the storage capacitor Cst may hold a charge corresponding to the voltage corresponding to the data signal).

One electrode of the storage capacitor Cst is connected to the first power supply VDD, and the other electrode thereof is connected to the first node N1. The storage capacitor Cst may charge a voltage corresponding to a data signal to be supplied to the first node N1 during each frame period.

Although in FIG. 5A the transistors, e.g., the first and second transistors T1 and T2, included in the pixel circuit PXC have been illustrated as being formed of P-type transistors, the present disclosure is not limited to this. In other words, any one of the first and second transistors T1 and T2 may be changed to an N-type transistor.

For example, as shown in FIG. 5B, both the first and second transistors T1 and T2 may be formed of N-type transistors. The configuration and operation of the pixel PXL illustrated in FIG. 5B, other than the fact that connection positions of some circuit elements are changed depending on a change in type of the transistors, are substantially similar to those of the pixel PXL of FIG. 5A. Therefore, detailed description of the pixel PXL of FIG. 5B may not be repeated. For example, in the pixel circuit PXC of FIG. 5B, the capacitor Cst is connected between the first node N1 and the second power supply VSS. Also, in the pixel circuit PXC of FIG. 5B, the light source unit LSU is connected between the first power supply VDD and a first electrode of the first transistor T1, and the first transistor T1 is connected between the second electrode of the light source unit LSU and the second power supply VSS.

The structure of the pixel circuit PXC is not limited to the embodiments shown in FIGS. 5A and 5B. In other words, the pixel circuit PXC may be formed of a well-known pixel circuit which may have various structures and/or be operated by various driving schemes. For example, the pixel circuit PXC may be configured in the same manner as that of an embodiment illustrated in FIG. 5C.

Referring to FIG. 5C, the pixel circuit PXC may be connected not only to a scan line Si of a corresponding horizontal line but also to at least one other scan line (or a control line). For example, the pixel circuit PXC of the pixel PXL disposed in the i-th row of the display area DA may be further connected to an i−1-th scan line Si−1 (e.g., a preceding scan line) and/or an i+1-th scan line Si+1 (e.g., a scan line of a subsequent stage). In an embodiment, the pixel circuit PXC may be connected not only to the first and second power supplies VDD and VSS but also to a third power supply. For instance, the pixel circuit PXC may also be connected to an initialization power supply Vint. In an embodiment, the pixel circuit PXC may include first to seventh transistors T1 to T7 and a storage capacitor Cst.

The first transistor T1 is connected between the first power supply VDD (e.g., via a fifth transistor T5 and a first power line PL1) and the first electrode of the light source unit LSU (e.g., via a sixth transistor T6 and a second node N2). A gate electrode of the first transistor T1 is connected to a first node N1. The first transistor T1 may control driving current to be supplied to the light source unit LSU in response to a voltage of the first node N1.

The second transistor T2 is connected between the data line Dj and one electrode of the first transistor T1. A gate electrode of the second transistor T2 is connected to the corresponding scan line Si. When a scan signal of a gate-on voltage (e.g., a low level voltage) is supplied from the scan line Si, the second transistor T2 may be turned on to electrically connect the data line Dj to the one electrode of the first transistor T1. Hence, if the second transistor T2 is turned on, a data signal supplied from the data line Dj may be transmitted to the first transistor T1.

The third transistor T3 is connected between the other electrode of the first transistor T1 and the first node N1. A gate electrode of the third transistor T3 is connected to the corresponding scan line Si. When a scan signal of a gate-on voltage (e.g., a low level voltage) is supplied from the scan line Si, the third transistor T3 may be turned on to electrically connect the first transistor T1 in the form of a diode (e.g., the first transistor T1 may be diode-connected).

The fourth transistor T4 may be connected between the first node N1 and an initialization power supply Vint. A gate electrode of the fourth transistor T4 is connected to the preceding scan line, e.g., an i−1-th scan line Si−1. When a scan signal of a gate-on voltage (e.g., a low level voltage) is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 is connected between the first power supply VDD and the one electrode of the first transistor T1. A gate electrode of the fifth transistor T5 is connected to a corresponding emission control line, e.g., an i-th emission control line Ei. The fifth transistor T5 may be turned off when an emission control signal of a gate-off voltage (e.g., a high voltage) is supplied to the emission control line Ei, and may be turned on when an emission control signal of a gate-on voltage (e.g., a low voltage) is supplied to the emission control line Ei.

The sixth transistor T6 is connected between the other electrode of the first transistor T1 and a second node N2, which is connected to the first electrode of the light source unit LSU. A gate electrode of the sixth transistor T6 is connected to a corresponding emission control line, e.g., the i-th emission control line Ei. The sixth transistor T6 may be turned off when an emission control signal of a gate-off voltage (e.g., a high voltage) is supplied to the emission control line Ei, and may be turned on when an emission control signal of a gate-on voltage (e.g., a low voltage) is supplied to the emission control line Ei.

The seventh transistor T7 is connected between the second node N2 (or the first electrode of the light source unit LSU) and the initialization power supply Vint. A gate electrode of the seventh transistor T7 is connected to any one of scan lines of a subsequent stage, e.g., to the i+1-th scan line Si+1. When a scan signal of a gate-on voltage (e.g., a low level voltage) is supplied to the i+1-th scan line Si+1, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage (or a charge) corresponding both to the data signal applied to the first node N1 during each frame period and to the threshold voltage of the first transistor T1.

Although in FIG. 5C the transistors, e.g., the first to seventh transistors T1 to T7, included in the pixel circuit PXC have been illustrated as being formed of P-type transistors, the present disclosure is not limited to this. For example, at least one of the first to seventh transistors T1 to T7 may be changed to an N-type transistor.

The structure of the pixel PXL which may be applied to the present disclosure is not limited to the embodiments illustrated in FIGS. 5A-5C, and each pixel PXL may have various well-known structures. For example, the pixel circuit PXC included in each pixel PXL may be formed of a well-known pixel circuit which may have various structures and/or be operated by various driving schemes. In an embodiment of the present disclosure, each pixel PXL may be configured in a passive light emitting display device, or the like. In this case, the pixel circuit PXC may be omitted, and each of the first and second pixel electrodes of the light source unit LSU may be directly connected to the scan line Si, the data line Dj, a power line, and/or the control line.

Figure 6A:
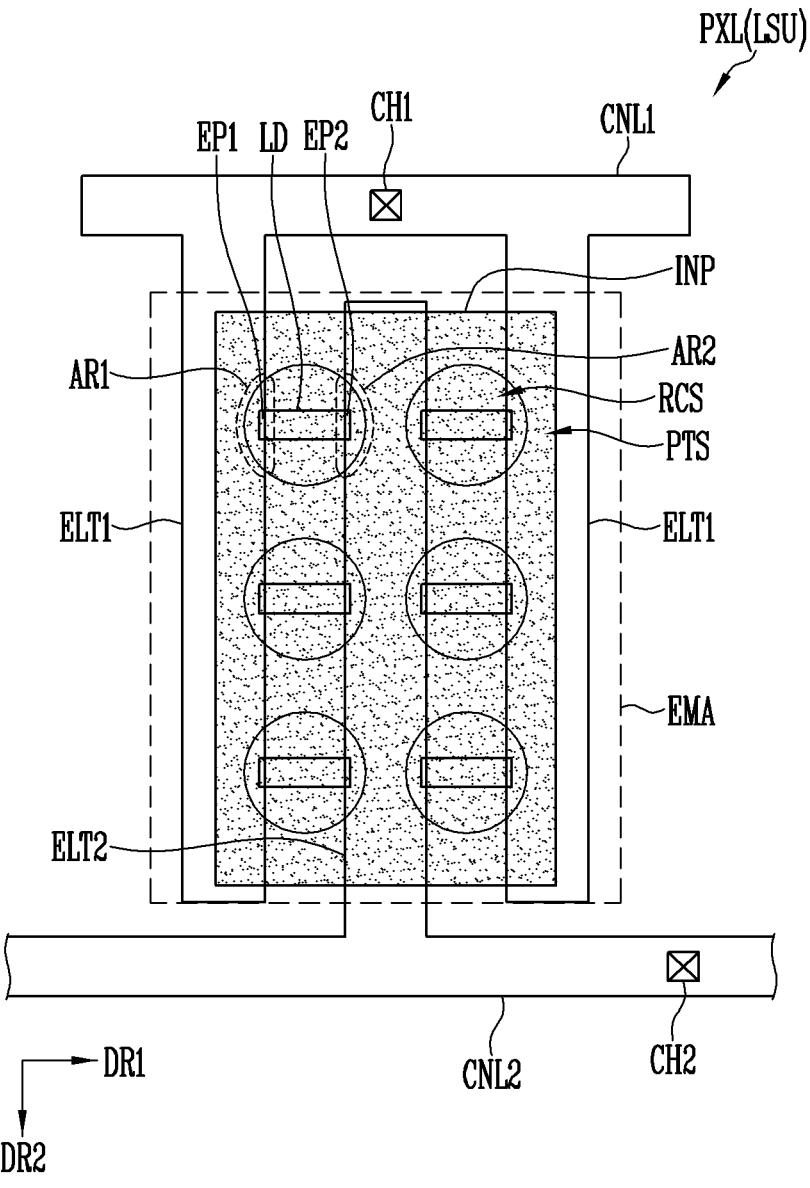
FIGS. 6A and 6B each are a plan view illustrating a light emitting device in accordance with an embodiment of the present disclosure, and for example illustrate different embodiments of a pixel including a light source unit formed of the light emitting device.
Figure 6B:
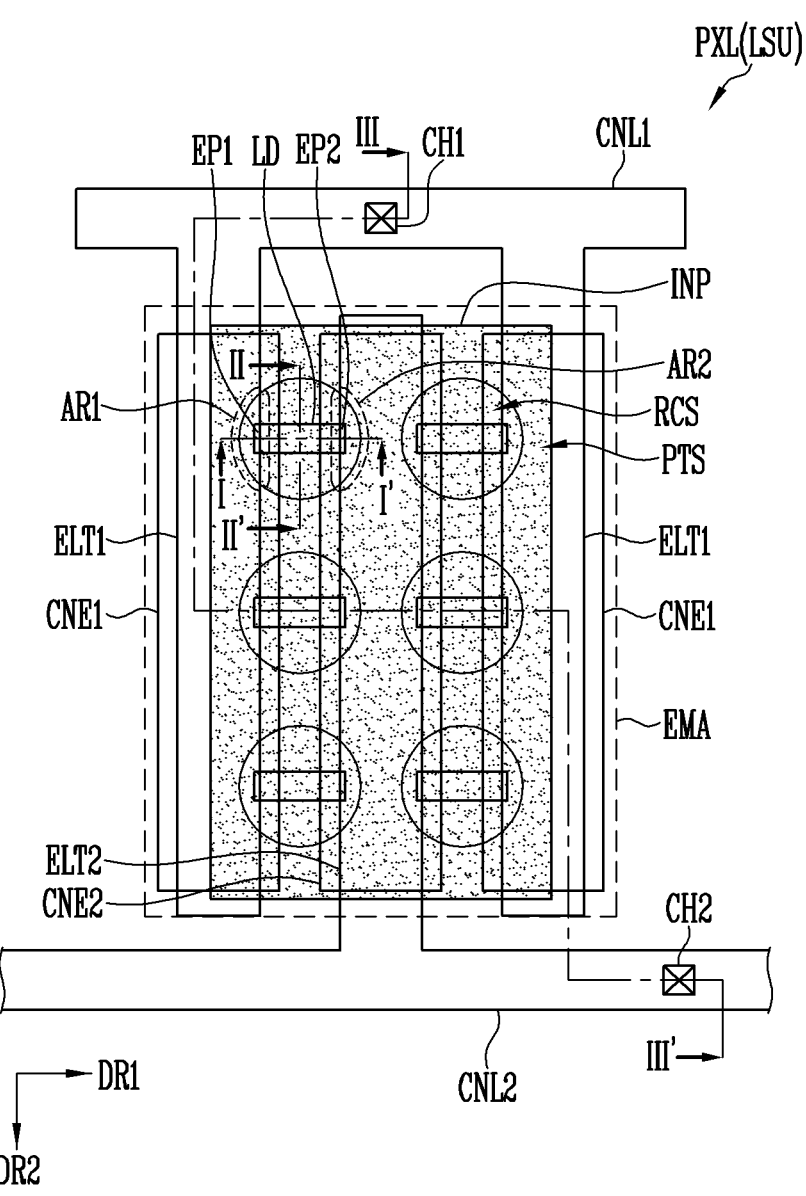
Figure 7:
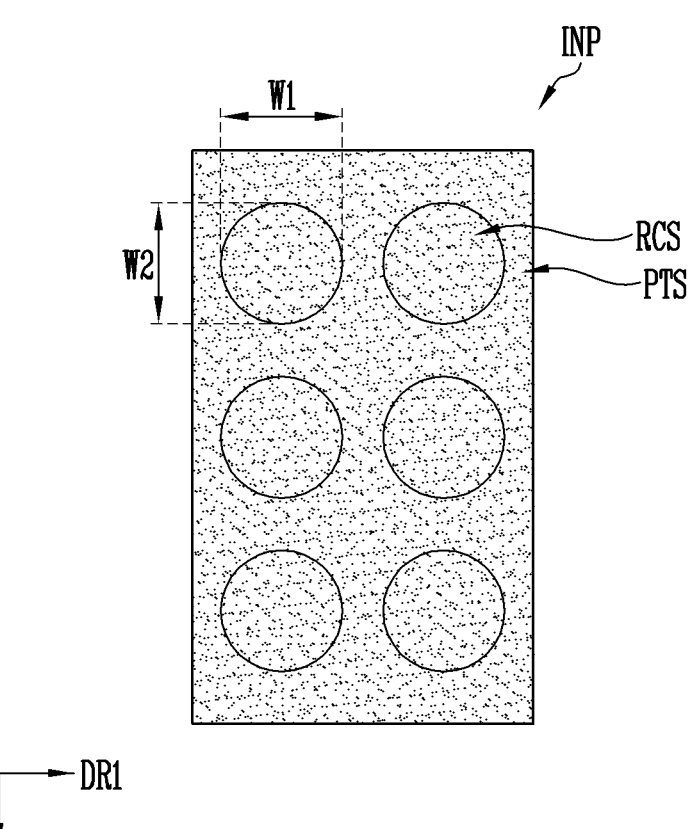
FIG. 7 is a plan view illustrating an insulating pattern in accordance with the embodiments of FIGS. 6A and 6B.

FIGS. 6A and 6B each are a plan view illustrating a light emitting device in accordance with an embodiment of the present disclosure, and for example illustrate different embodiments of a pixel PXL including a light source unit LSU formed of the light emitting device. In an embodiment, the pixel PXL may be any one pixel PXL illustrated in FIGS. 4-5C, but the present disclosure is not limited thereto. FIG. 7 is a plan view illustrating an insulating pattern INP in accordance with the embodiments of FIGS. 6A and 6B.

Although for the sake of explanation FIGS. 6A and 6B illustrate only a display element layer on which the light source unit LSU is disposed, each pixel PXL may selectively further include a circuit element (e.g., at least one circuit element for forming the pixel circuit PXC of FIGS. 5A-5C) configured to control the light source unit LSU. Furthermore, in an embodiment, FIGS. 6A and 6B illustrate an embodiment in which the light source unit LSU is connected, through first and second contact holes CH1 and CH2, to a power line (e.g., a set or predetermined power line) (e.g., first and/or second power lines PL1 and/or PL2), a circuit element (e.g., at least one circuit element that forms the pixel circuit PXC), and/or a signal line (e.g., a scan line Si and/or a data line Dj), but the present disclosure is not limited thereto. For example, in an embodiment of the present disclosure, at least one of the first and second electrodes ELT1 and ELT2 provided in the light emitting device may be directly connected to a power line (e.g., a set or predetermined power line) and/or signal line without passing through a contact hole and/or an intermediate line.

Referring to FIGS. 6A-7, the light emitting device and the pixel PXL including the light emitting device in accordance with an embodiment of the present disclosure may include an emission area (e.g., a set or predetermined emission area EMA), at least one first electrode ELT1 and at least one second electrode ELT2 which are disposed in the emission area EMA, and at least one light emitting diode LD connected between the first and second electrodes ELT1 and ELT2. For example, the pixel PXL may include a plurality of light emitting diodes LD connected in series and/or parallel to each other between the first and second electrodes ELT1 and ELT2. Furthermore, the pixel PXL may further include an insulating pattern INP disposed in the emission area EMA and provided to overlap with the first and second electrodes ELT1 and ELT2. In an embodiment, the insulating pattern INP may be disposed under the first and second electrodes ELT1 and ELT2 and the light emitting diodes LD.

In some embodiments, the pixel PXL may selectively further include at least one first contact electrode CNE1 provided to overlap with each first electrode ELT1, and/or at least one second contact electrode CNE2 provided to overlap with each second electrode ELT2. For example, the pixel PXL in accordance with an embodiment may not include the first and second contact electrodes CNE1 and CNE2, as illustrated in FIG. 6A. In this case, the light emitting diodes LD may be directly connected to the first and second electrodes ELT1 and ELT2. The pixel PXL in accordance with an embodiment may include the first and second contact electrodes CNE1 and CNE2, as illustrated in FIG. 6B. In this case, the light emitting diodes LD may be connected to the first and second electrodes ELT1 and ELT2 through the first and second contact electrodes CNE1 and CNE2, or directly connected both to the first and second contact electrodes CNE1 and CNE2 and to the first and second electrodes ELT1 and ELT2.

The emission area EMA may be an area in which light emitting diodes LD (e.g., valid or effective light emitting diodes validly connected between the first and second electrodes ELT1 and ELT2) that form the light source unit LSU of the pixel PXL are disposed. The emission area EMA may be enclosed by a light shielding or reflective bank (also referred to as "pixel defining layer").

The insulating pattern INP may include at least one recess RCS, and a protrusion PTS which protrudes the recess RCS. For example, the insulating pattern INP may include a plurality of recesses RCS which are dispersed at intervals (e.g., set or predetermined intervals) in the emission area EMA in a first direction DR1 and a second direction DR2. In an embodiment, the recesses RCS may be uniformly dispersed in the emission area EMA. For example, the recesses RCS may be uniformly distributed at intervals (e.g., set or predetermined intervals) in the first and/or second direction DR1 and/or DR2. In an embodiment, a plurality of recesses RCS may be unevenly dispersed in the insulating pattern INP.

In an embodiment, each recess RCS may be disposed in an area including one area formed between the first and second electrodes ELT1 and ELT2. Furthermore, when at least one light emitting diode LD is oriented (or arranged longitudinally) in the first direction DR1 (e.g., a horizontal direction or an X-axial direction) between the first and second electrodes ELT1 and ELT2 (e.g., in a direction crossing the first and second electrodes ELT1 and ELT2) and connected between one pair of first and second electrodes ELT1 and ELT2 corresponding to each other, each recess RCS may have a first width W1 greater than the length of each light emitting diode LD with respect to at least the first direction DR1. Furthermore, in an embodiment, each recess RCS may have a second width W2 equal to the first width W1 with respect to the second direction DR2 (e.g., a vertical direction or a Y-axial direction) intersecting (e.g., perpendicular to) the first direction DR1. For example, each recess RCS may have a circular shape having a diameter of W1 or W2 in a plan view. However, the shape of the recess RCS may be changed in various ways. For example, in a plan view, each recess RCS may have a circular shape, an elliptical shape, a polygonal shape, or a combination thereof.

A surface of the insulating pattern INP may have an uneven profile by the recess RCS and the protrusion PTS. The first and second electrodes ELT1 and ELT2 and the light emitting diodes LD may be disposed on the insulating pattern INP.

The first electrode ELT1 and the second electrode ELT2 may be spaced from each other and disposed such that at least portions thereof face each other (or opposite to each other). For example, the first and second electrodes ELT1 and ELT2 may be provided on a base layer (BSL of FIG. 4) on which the insulating pattern INP is disposed, and may be disposed in parallel at positions spaced from each other by a distance (e.g., a set or predetermined distance) in the first direction DR1. For example, the first and second electrodes ELT1 and ELT2 may be disposed in the emission area EMA at positions spaced from each other by a distance (e.g., a set or predetermined distance) with respect to the first direction DR1, and each may have a bar shape extending in the second direction DR2 intersecting with (e.g., perpendicular to) the first direction DR1. However, the present disclosure is not limited to this, and the shapes, and/or the relative disposition relationship of the first and second electrodes ELT1 and ELT2 may be changed in various ways.

Each of the first and second electrodes ELT1 and ELT2 may have a single-layer or multi-layer structure. For example, each first electrode ELT1 may include at least one reflective electrode layer, and selectively further include at least one transparent electrode layer and/or a conductive capping layer. Likewise, each second electrode ELT2 may include at least one reflective electrode layer, and selectively further include at least one transparent electrode layer and/or a conductive capping layer.

In an embodiment, the first electrode ELT1 may be electrically connected to a circuit element (e.g., a set or predetermined circuit element) (e.g., at least one transistor that forms the pixel circuit PXC), a power line (e.g., the first power line PL1), and/or a signal line (e.g., a scan line Si, a data line Dj, or a control line (e.g., a set or predetermined control line)) through a first connection electrode CNL1 and a first contact hole CH1. For example, the first electrode ELT1 may be electrically connected to a circuit element (e.g., a set or predetermined circuit element) disposed therebelow, through the first connection electrode CNL1 and the first contact hole CH1. Alternatively, in an embodiment, the first electrode ELT1 may be directly connected to a power line (e.g., a set or predetermined power line) or signal line without passing through the first connection electrode CNL1, the first contact hole CH1, and/or the circuit element. In this case, the first electrode ELT1 may be integrally or non-integrally connected to the power line (e.g., the set or predetermined power line) or the signal line.

In an embodiment, the first electrode ELT1 and the first connection electrode CNL1 may extend in different directions. For example, when the first connection electrode CNL1 extends in the first direction DR1, the first electrode ELT1 may extend in the second direction DR2 intersecting with the first direction DR1.

In an embodiment, the first electrode ELT1 and the first connection electrode CNL1 may be integrally connected with each other. For instance, the first electrode ELT1 may diverge in at least one way from the first connection electrode CNL1. In the case where the first electrode ELT1 and the first connection electrode CNL1 are integrally connected with each other, the first connection electrode CNL1 may be regarded as an area of the first electrode ELT1. However, the present disclosure is not limited thereto. For example, in an embodiment, the first electrode ELT1 and the first connection electrode CNL1 may be individually formed, and electrically connected to each other through at least one contact hole or via hole, or the like.

In an embodiment, the second electrode ELT2 may be electrically connected to a circuit element (e.g., a set or predetermined circuit element) (e.g., at least one transistor that forms the pixel circuit PXC), a power line (e.g., the second power line PL2), and/or a signal line (e.g., a scan line Si, a data line Dj, or a control line (e.g., a set or predetermined control line)) through a second connection electrode CNL2 and a second contact hole CH2. For example, the second electrode ELT2 may be electrically connected to the second power line PL2 disposed therebelow, through the second connection electrode CNL2 and the second contact hole CH2. Alternatively, in an embodiment, the second electrode ELT2 may be directly connected to a power line (e.g., a set or predetermined power line) or signal line without passing through the second connection electrode CNL2 and/or the second contact hole CH2. In this case, the second electrode ELT2 may be integrally or non-integrally connected to the power line (e.g., the set or predetermined power line) or the signal line.

In an embodiment, the second electrode ELT2 and the second connection electrode CNL2 may extend in different directions. For example, when the second connection electrode CNL2 extends in the first direction DR1, the second electrode ELT2 may extend in the second direction DR2 intersecting with the first direction DR1.

In an embodiment, the second electrode ELT2 may be integrally connected with the second connection electrode CNL2. For instance, the second electrode ELT2 may diverge in at least one way from the second connection electrode CNL2. In the case where the second electrode ELT2 and the second connection electrode CNL2 are integrally connected with each other, the second connection electrode CNL2 may be regarded as an area of the second electrode ELT2. However, the present disclosure is not limited thereto. For example, in an embodiment, the second electrode ELT2 and the second connection electrode CNL2 may be separately formed, and electrically connected to each other through at least one contact hole or via hole, or the like.

In an embodiment, the first and second electrodes ELT1 and ELT2 may be disposed on the insulating pattern INP and provided to overlap with different areas of at least one recess RCS formed in the insulating pattern INP. For example, each first electrode ELT1 may overlap both with a first area AR1 of at least one recess RCS from among a plurality of recesses RCS formed in the insulating pattern INP and with the protrusion PTS in a periphery of the first area AR1. Each second electrode ELT2 may overlap both with a second area AR2 of the at least one recess RCS and with the protrusion PTS in a periphery of the second area AR2. In an embodiment, each second area AR2 may be an area that faces away from the corresponding first area AR1. For example, each recess RCS may include the first area AR1 that overlaps with the first electrode ELT1, and the second area AR2 that is disposed at a position opposite to the first area AR1 and overlaps with the second electrode ELT2 corresponding to (or adjacent to) the first electrode ELT1.

The first and second electrodes ELT1 and ELT2 each may have an uneven portion corresponding to the shape of the insulating pattern INP. For example, the first and second electrodes ELT1 and ELT2 each may be recessed downward in an area thereof corresponding to the recess RCS of the insulating pattern INP, and protrude upward in an area thereof corresponding to the protrusion PTS of the insulating pattern INP. The first and second electrodes ELT1 and ELT2 each may have an inclined surface or a curved surface corresponding to a profile of the insulating pattern INP in a boundary area between the recess RCS and the protrusion PTS of the insulating pattern INP.

At least one light emitting diode LD may be disposed in each emission area EMA in which the insulating pattern INP and the first and second electrodes ELT1 and ELT2 are disposed. For example, in each recess RCS, at least one light emitting diode LD may be disposed. For instance, the at least one light emitting diode LD may be disposed in the recess RCS such that the at least one light emitting diode LD is enclosed or surrounded by any one recess RCS.

In an embodiment, when the insulating pattern INP includes a plurality of recesses RCS, at least one light emitting diode LD may be disposed in each of the recesses RCS. However, the present disclosure is not limited thereto.

For example, in an embodiment, at least one light emitting diode LD may be disposed in only some of the plurality of recesses RCS.

Each light emitting diode LD may be electrically connected between the first and second electrodes ELT1 and ELT2 corresponding to (or adjacent to) each other. For example, each light emitting diode LD may be a rod-type light emitting diode having a longitudinal direction. Furthermore, the light emitting diode LD may include a first end EP1 which is disposed on one end thereof with respect to the longitudinal direction and electrically connected to the first electrode ELT1, and a second end EP2 which is disposed on the other end thereof with respect to the longitudinal direction and electrically connected to the second electrode ELT2. For example, in an area (e.g., in each recess RCS) in which the first and second electrodes ELT1 and ELT2 corresponding to each other are disposed to face each other, each light emitting diode LD may be arranged in a horizontal direction along the first direction DR1 between the first and second electrodes ELT1 and ELT2.

Although FIGS. 6A and 6B illustrate that the light emitting diodes LD are uniformly oriented in any one direction, e.g., in the first direction DR1, the present disclosure is not limited thereto. For example, at least one of the light emitting diodes LD may be oriented in a diagonal direction between the first and second electrodes ELT1 and ELT2. Alternatively, although not illustrated in FIGS. 6A and 6B, at least one invalid light emitting diode, which is not completely connected between the first and second electrodes ELT1 and ELT2, may be further disposed in each emission area EMA and/or a peripheral area thereof.

In an embodiment, each light emitting diode LD may be a light emitting diode which is made of material having an inorganic crystal structure and has a subminiature size, e.g., ranging from the nanoscale to the microscale. For example, each light emitting diode LD may be a subminiature rod-type light emitting diode which has a diameter D and/or a length L ranging from the nanoscale to the microscale, as illustrated in FIGS. 1A-3B. However, the size of the light emitting diode LD may be changed in various ways depending on design conditions, etc. of each light emitting device, e.g., the pixel PXL.

In an embodiment, the first ends EP1 of the light emitting diodes LD (e.g., valid or effective light emitting diodes LD completely connected between the first and second electrodes ELT1 and ELT2) may be electrically connected to the first electrode ELT1 via the first contact electrode CNE1. The second ends EP2 of the light emitting diodes LD may be connected to the second electrode ELT2 via the second contact electrode CNE2. In an embodiment, at least one of the first and second ends EP1 and EP2 of each light emitting diode LD may come into direct contact with the first and/or second electrodes ELT1 and/or ELT2 and may be electrically connected to the first and/or second electrodes ELT1 and/or ELT2.

In an embodiment, the light emitting diodes LD may be prepared in a diffused form in a solution (e.g., a set or predetermined solution), and then supplied to the emission area EMA by an inkjet scheme or the like. For example, the light emitting diodes LD may be mixed with a volatile solvent and supplied to each emission area EMA. Here, if alignment voltages (e.g., set or predetermined alignment voltages) (or alignment signals) are applied to the first and second electrodes ELT1 and ELT2, an electric field is formed between the first and second electrodes ELT1 and ELT2, whereby the light emitting diodes LD may be aligned between the first and second electrodes ELT1 and ELT2.

After the light emitting diodes LD have been aligned, the solvent may be removed by a volatilization scheme or other schemes. In this way, the light emitting diodes LD may be reliably arranged between the first and second electrodes ELT1 and ELT2. Furthermore, the first contact electrode CNE1 and the second contact electrode CNE2 may be respectively formed on the opposite ends of the light emitting diodes LD, i.e., the first and second ends EP1 and EP2. Consequently, the light emitting diodes LD may be more reliably connected between the first and second electrodes ELT1 and ELT2.

In an embodiment, the first contact electrode CNE1 may be formed on the first ends EP1 of the light emitting diodes LD and at least one area of the first electrode ELT1, whereby the first ends EP1 of the light emitting diodes LD may be electrically connected to the first electrode ELT1. Likewise, the second contact electrode CNE2 may be formed on the second ends EP2 of the light emitting diodes LD and at least one area of the second electrode ELT2, whereby the second ends EP2 of the light emitting diodes LD may be electrically connected to the second electrode ELT2. Furthermore, the first and second contact electrodes CNE1 and CNE2 fasten the first and second ends EP1 and EP2 of each of the light emitting diodes LD, so that the light emitting diodes LD can be prevented from being removed from the aligned positions thereof.

If the first ends EP1 of the light emitting diodes LD are connected to the first power supply VDD via the first electrode ELT1 and/or the pixel circuit PXC, etc., and the second ends EP2 of the light emitting diodes LD are connected to the second power supply VSS via the second electrode ELT2 and/or the second power line PL2, etc., at least one light emitting diode LD connected in the forward direction between the first and second electrodes ELT1 and ELT2 may emit light at a luminance corresponding to driving current supplied from the pixel circuit PXC or the like. Thereby, the pixel PXL may emit light.

Figure 8A:
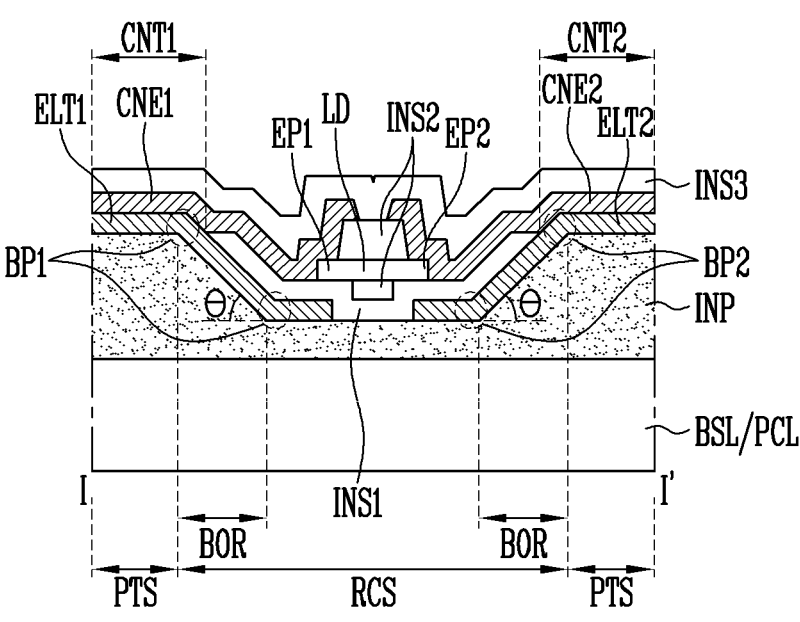
FIGS. 8A and 8B each are a sectional view illustrating a light emitting device in accordance with an embodiment of the present disclosure, and for example illustrate different embodiments of a cross-section corresponding to the line I-I' of FIG. 6B.
Figure 8B:
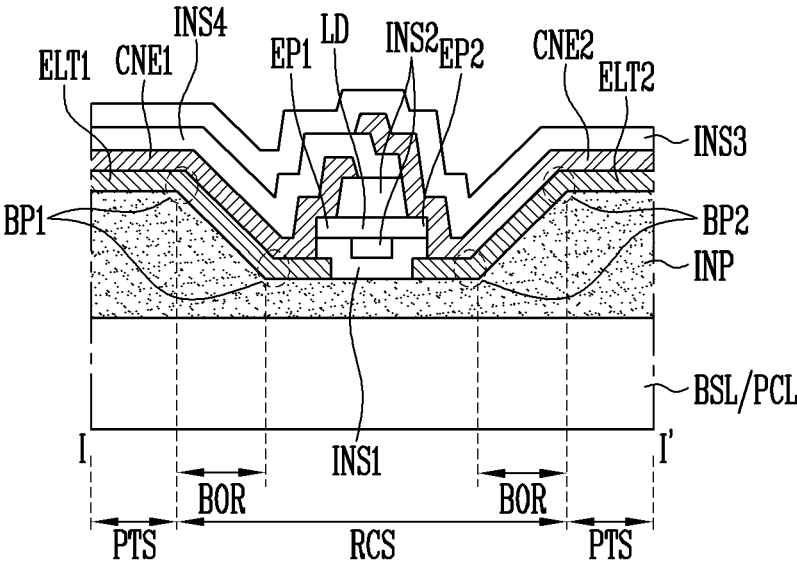
Figure 9:
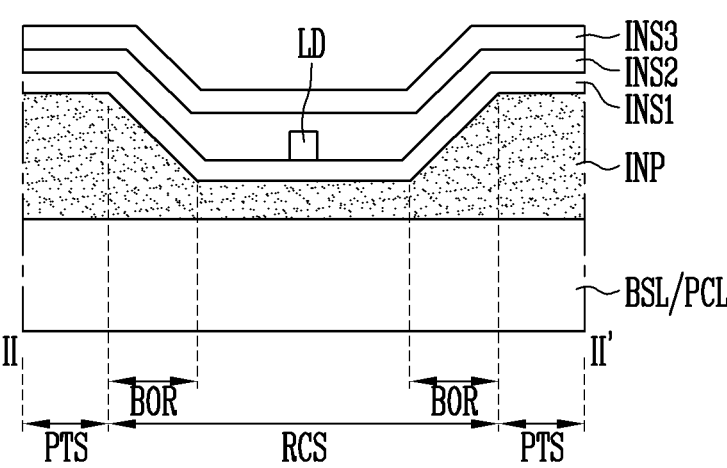
FIG. 9 is a sectional view illustrating a light emitting device in accordance with an embodiment of the present disclosure, and for example illustrates an embodiment of a cross-section corresponding to the line II-II' of FIG. 6B.

FIGS. 8A and 8B each are a sectional view illustrating a light emitting device in accordance with an embodiment of the present disclosure, and for example illustrate different embodiments of a cross-section corresponding to the line I-I' of FIG. 6B. FIG. 9 is a sectional view illustrating a light emitting device in accordance with an embodiment of the present disclosure, and for example illustrates an embodiment of a cross-section corresponding to the line II-II' of FIG. 6B.

Referring to FIGS. 6A-9, the light emitting device in accordance with an embodiment of the present disclosure (e.g., the pixel PXL including the light source unit LSU formed of the light emitting device) may include the base layer BSL, and the insulating pattern INP, the first and second electrodes ELT1 and ELT2, a first insulating layer INS1, at least one light emitting diode LD, a second insulating layer INS2, first and second contact electrodes CNE1 and CNE2, and a third insulating layer INS3. In an embodiment, the light emitting device may selectively further include a pixel circuit layer PCL between the base layer BSL and the insulating pattern INP.

The pixel circuit layer PCL may include at least one circuit element (e.g., at least one transistor and/or capacitor) that forms the pixel circuit PXC, and at least one power line and/or a signal line, etc. Here, in the case where the light emitting device is directly connected to the first and second power lines PL1 and PL2 (or signal lines (e.g., set or predetermined signal lines)), the pixel circuit layer PCL may be omitted.

The insulating pattern INP may include insulating material including inorganic material or organic material. For example, the insulating pattern INP may include at least one inorganic layer including various known inorganic insulating materials such as SiNx or SiOx. Alternatively, the insulating pattern INP may include at least one organic layer and/or photoresist layer containing various known organic insulating materials, or may form a single- or multi-layer insulator containing organic/inorganic materials in combination. In an embodiment of the present disclosure, the constituent material in the insulating pattern INP may be changed in various ways.

In an embodiment, the insulating pattern INP may function as a reflector. For example, the insulating pattern INP, along with the first and second electrodes ELT1 and ELT2 provided thereover, may function as a reflector that guides light emitted from each light emitting diode LD in a desired direction, thus enhancing the optical efficiency of the pixel PXL.

In an embodiment, the insulating pattern INP may include at least one recess RCS in which the light emitting diode LD, etc. are disposed, and a protrusion PTS around the recess RCS. For example, the protrusion PTS may enclose or surround the recess RCS. The recess RCS may include an inclined surface having an inclination within an angle range (e.g., a set or a predetermined angle (θ) range), in a perimeter area BOR adjacent to the protrusion PTS. In an embodiment, the insulating pattern INP may include a recess RCS having an angle (θ) ranging from 40° to 50°. In this case, light emitted from the opposite ends of the light emitting diodes LD, i.e., the first and second ends EP1 and EP2, may be guided to travel in a frontal direction (e.g., toward a front surface of the display panel PNL). Therefore, the optical efficiency of each light emitting device and the pixel PXL including the light emitting device can be enhanced.

However, the present disclosure is not limited to the foregoing structure, and the shape of the insulating pattern INP may be changed in various ways. For example, in an embodiment of the present disclosure, the range of the inclination of the inclined surface may be changed, or the recess RCS may be formed by recessing the insulating pattern INP such that at least one area of the insulating pattern INP has a smooth curved surface.

In an embodiment, to form a bend on the surface of the insulating pattern INP, during a process of forming the insulating pattern INP, the insulating pattern INP may be patterned at different heights in areas through at least two mask processes, or the insulating pattern INP may be patterned at different heights in areas through a single mask process using a halftone mask. In this way, the recess RCS and the protrusion PTS may be formed in the surface of the insulating pattern INP. In other words, the process of forming the insulating pattern INP is not particularly limited, and may be changed in various ways depending on embodiments.

In an embodiment, a difference in height between the recess RCS and the protrusion PTS may be set to a value enough to receive each light emitting diode LD in the recess RCS. In this case, the insulating pattern INP may enclose an overall side of the light emitting diode LD disposed in the recess RCS.

The first and second electrodes ELT1 and ELT2 may be disposed on the insulating pattern INP at positions that are spaced from each other. In an embodiment, the first and second electrodes ELT1 and ELT2 may be formed of bar-shaped electrodes disposed in parallel to each other at positions that are spaced from each other by a distance (e.g., a set or predetermined distance) with respect to the first direction DR1, as illustrated in FIGS. 6A and 6B. In this case, a manufacturing process may be easily performed. Here, the shapes of the first and second electrodes ELT1 and ELT2 may be changed in various ways depending on embodiments.

Each of the first and second electrodes ELT1 and ELT2 may include at least one conductive material. For example, each of the first and second electrodes ELT1 and ELT2 may include at least one of metals such as Ag, Mg, Al, Pt, Pd, Au, Ni, Nd, Ir, Cr, T1 or an alloy thereof, conductive oxide such as ITO, IZO, ZnO, or ITZO, and a conductive polymer such as PEDOT; however, it is not limited thereto.

Each of the first and second electrodes ELT1 and ELT2 may have a single-layer or multi-layer structure. For example, each of the first and second electrodes ELT1 and ELT2 may include at least one reflective electrode layer. Each of the first and second electrodes ELT1 and ELT2 may selectively further include at least one of at least one transparent electrode layer disposed over and/or under the reflective electrode layer, and at least one conductive capping layer covering an upper portion of the reflective electrode layer and/or the transparent electrode layer.

In an embodiment, the reflective electrode layer of each of the first and second electrodes ELT1 and ELT2 may be formed of conductive material having a constant reflectivity. For example, the reflective electrode layer may include at least one of metals such as Ag, Mg, Al, Pt, Pd, Au, Ni, Nd, Ir, Cr, and an alloy thereof; however, the present disclosure is not limited thereto. In other words, reflective electrode layer may be formed of various reflective conductive materials. Each of the first and second electrodes ELT1 and ELT2 that includes the reflective electrode layer may enable light emitted from the opposite ends of each of the light emitting diodes LD, i.e., the first and second ends EP1 and EP2, to travel in a direction (e.g., in a frontal direction) in which an image is displayed. For example, if the first and second electrodes ELT1 and ELT2 have inclined or curved surfaces corresponding to the shape of the insulating pattern INP and are disposed to face the first and second ends EP1 and EP2 of the light emitting diodes LD, light emitted from the first and second ends EP1 and EP2 of each of the light emitting diodes LD may be reflected by the first and second electrodes ELT1 and ELT2 and thus further reliably travel in the frontal direction of the display panel PNL (e.g., in an upward direction of the base layer BSL). Hence, the efficiency of light emitted from the light emitting diodes LD may be enhanced.

Furthermore, the transparent electrode layer of each of the first and second electrodes ELT1 and ELT2 may be formed of various transparent electrode materials. For example, the transparent electrode layer may include ITO, IZO or ITZO, but the present disclosure is not limited thereto. In an embodiment, each of the first and second electrodes ELT1 and ELT2 may have a triple-layer structure having a stacked structure of ITO/Ag/ITO. As such, if the first and second electrodes ELT1 and ELT2 each are formed of a multi-layer structure of two or more layers, voltage drop due to signal delay (RC delay) may be reduced or minimized. Thus, a desired voltage can be effectively transmitted to the light emitting diodes LD.

In some embodiments, if each of the first and second electrodes ELT1 and ELT2 includes the conductive capping layer covering the reflective electrode layer and/or the transparent electrode layer, it is possible to prevent the reflective electrode layer of the first and second electrodes ELT1 and ELT2 from being damaged due to defects caused during the manufacturing process of the pixel PXL. However, the conductive capping layer may be selectively included in the first and second electrodes ELT1 and ELT2, and may be omitted according to an embodiment. Furthermore, the conductive capping layer may be considered as a component of each of the first and second electrodes ELT1 and ELT2, or considered as a separate component disposed on the first and second electrodes ELT1 and ELT2.

In an embodiment, the first and second electrodes ELT1 and ELT2 corresponding to each other may be disposed to face each other with at least one recess RCS interposed therebetween. Furthermore, the first and second electrodes ELT1 and ELT2 may be disposed on the insulating pattern INP such that the first and second electrodes ELT1 and ELT2 overlap with different areas of the recess RCS.

The first and second electrodes ELT1 and ELT2 each may have a bend corresponding to a surface profile of the insulating pattern INP. For example, the first and second electrodes ELT1 and ELT2 may respectively include first and second bent portions BP1 and BP2 having bent shapes on upper ends and lower ends of inclined surfaces connecting the recess RCS and the protrusion PTS of the insulating pattern INP. In an embodiment, the first bent portions BP1 formed on the first electrode ELT1 may have shapes symmetrical with that of the second bent portions BP2 formed on the second electrode ELT2. As such, if the first and second electrodes ELT1 and ELT2 respectively include first and second bent portions BP1 and BP2, an electric field generated between the first and second electrodes ELT1 and ELT2 may be further focused on the first and second bent portions BP1 and BP2 at the step of aligning the light emitting diodes LD. Hence, the number of light emitting diodes LD moved into and/or around the recess RCS may be increased, so that the light emitting diodes LD can be aligned between the first and second electrodes ELT1 and ELT2. Consequently, the efficiency of alignment of the light emitting diodes LD may be increased.

The first insulating layer INS1 may be formed to cover one area of each of the first and second electrodes ELT1 and ELT2, and may include an opening to expose another area of each of the first and second electrodes ELT1 and ELT2. In an embodiment, the first insulating layer INS1 may be primarily formed to cover the overall surfaces of the first and second electrodes ELT1 and ELT2. After the light emitting diodes LD are supplied and aligned over the first insulating layer INS1 (e.g., over the first insulating layer INS1 on the recess RCS), the first insulating layer INS1 may be patterned in form of an individual pattern in which as shown in FIG. 8A the first insulating layer INS1 is partially open to expose the first and second electrodes ELT1 and ELT2 respectively in first and second contact portions (e.g., set or predetermined first and second contact portions) CNT1 and CNT2, or as shown in FIG. 8B, the first insulating layer INS1 is sectionally disposed under the light emitting diodes LD.

In other words, the first insulating layer INS1 may be interposed between the first and second electrodes ELT1 and ELT2 and the light emitting diodes LD, and may expose one area of each of the first and second electrodes ELT1 and ELT2. After the first and second electrodes ELT1 and ELT2 are formed, the first insulating layer INS1 may be formed to cover the first and second electrodes ELT1 and ELT2, so that it is possible to prevent the first and second electrodes ELT1 and ELT2 from being damaged or to prevent metal from being precipitated in a subsequent process. Furthermore, the first insulating layer INS1 may stably support each light emitting diode LD.

A plurality of light emitting diodes LD may be supplied to and aligned on each emission area EMA on which the first insulating layer INS1 are formed. For example, the plurality of light emitting diodes LD may be supplied to each emission area EMA by an inkjet scheme, and at least some of the light emitting diodes LD may be aligned in the recess RCS.

For example, in each recess RCS, at least one light emitting diode LD may be disposed. For example, the light emitting diode LD may be disposed over the first insulating layer INS1 on the recess RCS and thus enclosed or surrounded by the recess RCS of the insulating pattern INP and/or the inclined surfaces (or the curved surfaces) of the first and second electrodes ELT1 and ELT2 that are disposed on the recess RCS. In other words, in an embodiment, the recess RCS of the insulating pattern INP and the first and second electrodes ELT1 and ELT2 may enclose the overall sidewall of the light emitting diode LD. Hence, light emitted from the light emitting diode LD may be reflected by the recess RCS of the insulating pattern INP and the first and second electrodes ELT1 and ELT2 and travel in the frontal direction of the light emitting device and the display device including the light emitting device (e.g., toward a front surface on which an image is displayed).

For example, among the light emitting diodes LD disposed in the recess RCS, the first end EP1 of the light emitting diode LD that is oriented in the first direction DR1 including an error angle range (e.g., a set or predetermined error angle range) may be disposed to face the inclined surface (or the curved surface) formed on the first electrode ELT1 by the insulating pattern INP. Furthermore, the second end EP2 of the light emitting diode LD may be disposed to face the inclined surface (or the curved surface) formed on the second electrode ELT2 by the insulating pattern INP. Each light emitting diode LD may emit light through the first and second ends EP1 and EP2. Hence, light emitted from the light emitting diode LD may more reliably travel in the front direction (e.g., in an upward direction of the base layer BSL in sectional views of FIGS. 8A-9). Furthermore, even when at least one light emitting diode LD disposed in each emission area EMA is disposed in a diagonal direction or the like between the first and second electrodes ELT1 and ELT2, light emitted from the light emitting diode LD may more reliably travel in the frontal direction if the light emitting diode LD is disposed in the recess RCS. In accordance with an embodiment of the present disclosure, the amount with which light emitted from the light emitting diodes LD travels in a desired direction may be increased. Hence, the efficiency of light emitted from each emission area EMA may be enhanced.

The second insulating layer INS2 may be disposed on the light emitting diodes LD, for example, at least one light emitting diode LD aligned between the first and second electrodes ELT1 and ELT2, and may expose the first and second ends EP1 and EP2 of the light emitting diode LD. For example, the second insulating layer INS2 may be partially disposed on only an upper portion of one area of the light emitting diode LD without covering the first and second ends EP1 and EP2 of the light emitting diode LD. The second insulating layer INS2 may be formed in an independent pattern on each emission area EMA; however, the present disclosure is not limited thereto.

As illustrated in FIGS. 8A and 8B, if space is present between the first insulating layer INS1 and the light emitting diodes LD before the second insulating layer INS2 is formed, the space may be filled with the second insulating layer INS2 during a process of forming the second insulating layer INS2. For example, in the case where the first insulating layer INS1 is formed of at least one inorganic insulating layer, the first insulating layer INS1 may be formed to be concave along a profile of a bottom surface between the first and second electrodes ELT1 and ELT2. In the case where the light emitting diodes LD each having a length greater than a width of a depression formed in the first insulating layer INS1 are horizontally disposed on the first insulating layer INS1, space may be formed between the light emitting diodes LD and the first insulating layer INS1. The space may be filled with insulating material for forming the second insulating layer INS2 at a subsequent processing step, e.g., at a processing step of forming the second insulating layer INS2 on the light emitting diodes LD. As such, if the second insulating layer INS2 is drawn under the light emitting diodes LD and charged into the space under the light emitting diodes LD, the light emitting diodes LD can be more stably supported.

The first and second contact electrodes CNE1 and CNE2 may be disposed on the first and second electrodes ELT1 and ELT2 and the first and second ends EP1 and EP2 of the light emitting diodes LD. In an embodiment, the first and second contact electrodes CNE1 and CNE2 may be disposed at the same layer, as illustrated in FIG. 8A. In this case, although the first and second contact electrodes CNE1 and CNE2 are formed through the same process using the same conductive material, the present disclosure is not limited thereto.

In an embodiment, the first and second contact electrodes CNE1 and CNE2 may be disposed on different layers, as illustrated in FIG. 8B. In this case, the first and second contact electrodes CNE1 and CNE2 may be formed through different processes using the same conductive material or different conductive materials. In the case where the first and second contact electrodes CNE1 and CNE2 are disposed on different layers, at least one insulating layer (e.g., a fourth insulating layer INS4) may be formed on a contact electrode disposed on a lower layer, e.g., the first contact electrode CNE1 (e.g., as shown in FIG. 8B).

The first and second contact electrodes CNE1 and CNE2 may respectively electrically connect the first and second ends EP1 and EP2 of the light emitting diodes LD to the first and second electrodes ELT1 and ELT2.

For example, the first contact electrode CNE1 may be disposed on each first electrode ELT1 to come into contact with the first electrode ELT1. For instance, the first contact electrode CNE1 may be disposed on one area (e.g., the first contact portion CNT1) of the first electrode ELT1 that is not covered by the first insulating layer INS1, so that the first contact electrode CNE1 comes into contact with the first electrode ELT1. Furthermore, the first contact electrode CNE1 may be disposed on the first end EP1 of at least one light emitting diode LD adjacent to the first electrode ELT1, e.g., the first contact electrode CNE1 may be disposed on the respective first ends EP1 of the plurality of light emitting diodes LD so that the first contact electrode CNE1 can come into contact with the first ends EP1. In other words, the first contact electrode CNE1 may be disposed to cover the respective first ends EP1 of the light emitting diodes LD and at least one area of the corresponding first electrode ELT1. Hence, the respective first ends EP1 of the light emitting diodes LD may be electrically connected to the first electrode ELT1.

Likewise, the second contact electrode CNE2 may be disposed on each second electrode ELT2 to come into contact with the second electrode ELT2. For instance, the second contact electrode CNE2 may be disposed on one area (e.g., the second contact portion CNT2) of the second electrode ELT2 that is not covered by the first insulating layer INS1, so that the second contact electrode CNE2 comes into contact with the second electrode ELT2. Furthermore, the second contact electrode CNE2 may be disposed on the second end EP2 of at least one light emitting diode LD adjacent to the second electrode ELT2, e.g., the second contact electrode CNE2 may be disposed on the respective second ends EP2 of the plurality of light emitting diodes LD so that the second contact electrode CNE2 can come into contact with the second ends EP2. In other words, the second contact electrode CNE2 may be disposed to cover the respective second ends EP2 of the light emitting diodes LD and at least one area of the corresponding second electrode ELT2. Hence, the respective second ends EP2 of the light emitting diodes LD may be electrically connected to the second electrode ELT2.

In the case where as illustrated in the embodiment of FIG. 6A the first and second contact electrodes CNE1 and CNE2 are not provided, the first and second ends EP1 and EP2 of the light emitting diodes LD may come into direct contact with the first and second electrodes ELT1 and ELT2. In this case, the first insulating layer INS1 may not be interposed between the first and second ends EP1 and EP2 of the light emitting diodes LD and the first and second electrodes ELT1 and ELT2.

The third insulating layer INS3 may be formed and/or disposed on one surface of the base layer BSL on which the insulating pattern INP, the first and second electrodes ELT1 and ELT2, the light emitting diodes LD, and the first and second contact electrodes CNE1 and CNE2 are formed, so that the third insulating layer INS3 can cover the first and second electrodes ELT1 and ELT2, the light emitting diodes LD, and the first and second contact electrodes CNE1 and CNE2. In an embodiment, the third insulating layer INS3 may include a thin-film encapsulation layer including at least one inorganic layer and/or organic layer.

In an embodiment, each of the first to fourth insulating layers INS1, INS2, INS3, and INS4 may have a single-layer or multi-layer structure, and include at least one inorganic insulating material and/or organic insulating material. For example, each of the first to fourth insulating layers INS1, INS2, INS3, and INS4 may include various kinds of well-known organic/inorganic insulating materials including SiNx, and the constituent material of each of the first to fourth insulating layers INS1, INS2, INS3, and INS4 is not particularly limited. The first to fourth insulating layers INS1, INS2, INS3, and INS4 may include different insulating materials, or at least some of the first to fourth insulating layers INS1, INS2, INS3, and INS4 may include the same insulating material.

Figure 10:
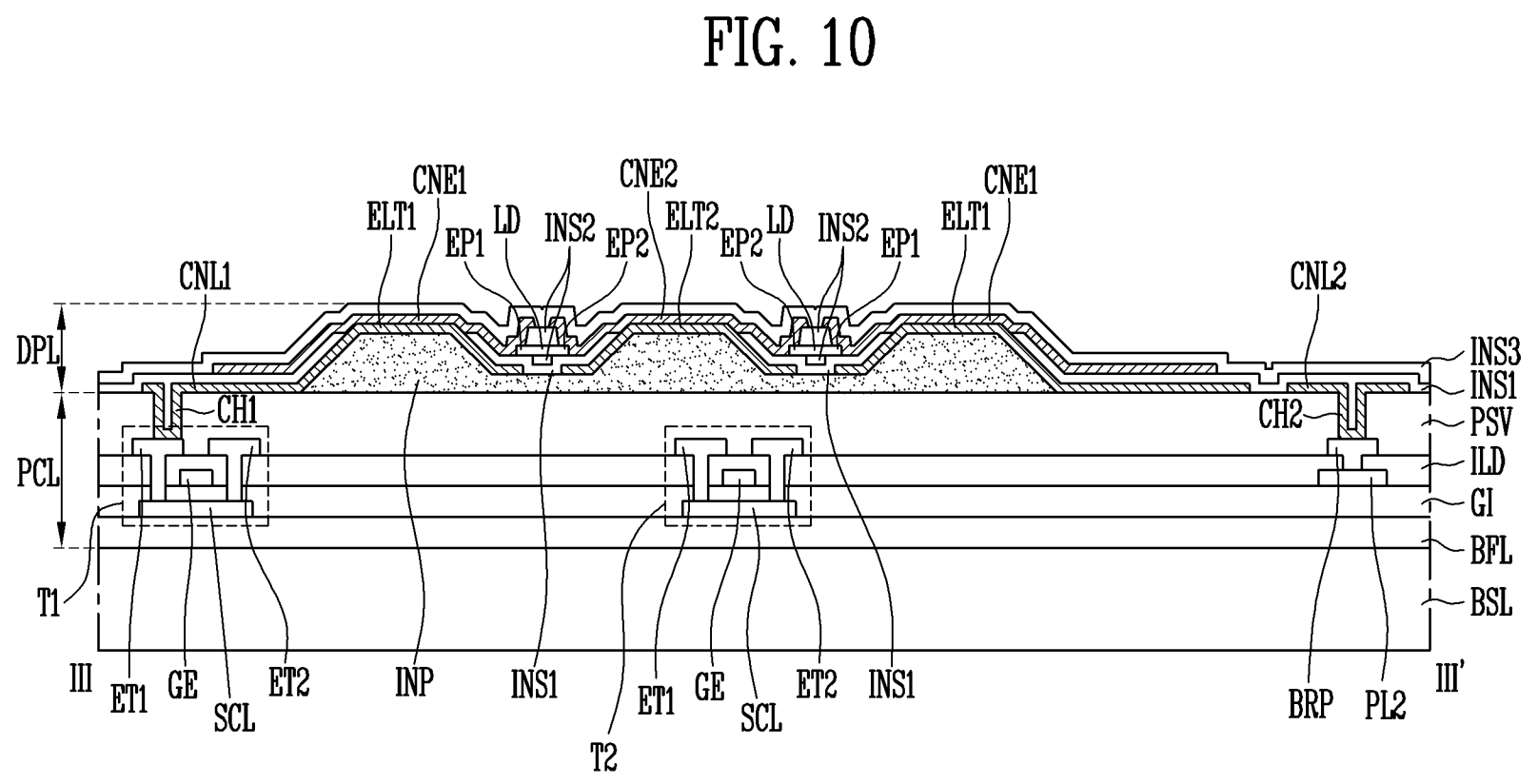

FIG. 10 is a sectional view illustrating a light emitting device in accordance with an embodiment of the present disclosure, and for example illustrates an embodiment of a cross-section corresponding to the line III-Ill' of FIG. 6B. In an embodiment, FIG. 10 illustrates some circuit elements and/or lines disposed in the pixel circuit layer PCL, and a connection structure between the pixel circuit layer PCL and a display element layer DPL disposed thereover (e.g., a layer on which the light emitting diodes LD that form the light source unit LSU are disposed). In FIG. 10, the same reference numerals are used to designate components similar or identical to those of the embodiment of FIGS. 6A-9, and further explanation thereof may not be repeated.

Referring to FIGS. 6A-10, the light emitting device in accordance with an embodiment of the present disclosure may include the pixel circuit layer PCL disposed between the base layer BSL and the display element layer DPL. For example, the pixel circuit layer PCL may be formed on a surface of the base layer BSL, and the display element layer DPL may be formed over the surface of the base layer BSL on which the pixel circuit layer PCL is formed. For example, the display element layer DPL may be formed on the pixel circuit layer PCL.

The pixel circuit layer PCL may include a pixel circuit for controlling the display element layer DPL, e.g., any one pixel circuit PXC illustrated in FIGS. 5A-5C, etc., and/or lines connected to the pixel circuit PXC. For example, the pixel circuit layer PCL may include first and second transistors T1 and T2 of FIG. 5A. The pixel circuit layer PCL may further include the storage capacitor Cst illustrated in FIGS. 5A-5C, etc., various signal lines (e.g., a scan line Si and a data line Dj) connected to each pixel circuit PXC, and various power lines (e.g., the first and second power lines PL1 and PL2) connected to the pixel circuit PXC and/or the light source unit LSU.

In an embodiment, a plurality of transistors, e.g., first and second transistors T1 and T2, provided in each pixel circuit PXC may have substantially an identical or similar cross-sectional structure. However, the present disclosure is not limited thereto. For example, in an embodiment, at least some of the plurality of transistors may have different types and/or structures.

In some embodiments, the pixel circuit layer PCL may include a plurality of insulating layers. For example, the pixel circuit layer PCL may include a buffer layer BFL, a gate insulating layer GI, an interlayer insulating layer ILD, and a passivation layer PSV which are successively stacked on one surface of the base layer BSL. The pixel circuit layer PCL may selectively further include at least one light shielding pattern disposed under at least some transistors.

The buffer layer BFL may prevent impurities from diffusing into each circuit element. The buffer layer BFL may be formed of a single layer, or may be formed of multiple layers having at least two or more layers. In the case where the buffer layer BFL has a multi-layer structure, the respective layers may be formed of the same material or different materials. In an embodiment, the buffer layer BFL may be omitted.

Each of the first and second transistors T1 and T2 may include a semiconductor layer SCL, a gate electrode GE, and first and second transistor electrodes ET1 and ET2. Although FIG. 10 illustrates an embodiment in which each of the first and second transistors T1 and T2 includes the first and second transistor electrodes ET1 and ET2 that are formed separately from the semiconductor layer SCL, the present disclosure is not limited thereto. For example, in an embodiment, the first and/or second transistor electrode ET1 and/or ET2 provided in at least one transistor disposed in each pixel area may be integrally formed with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which comes into contact with each first transistor electrode ET1, a second area which comes into contact with each second transistor electrode ET2, and a channel area disposed between the first and second areas. In an embodiment, one of the first and second areas may be a source area, and the other one may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with an impurity (e.g., a set or predetermined impurity).

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL (e.g., the channel region of the semiconductor layer SCL).

The first and second transistor electrodes ET1 and ET2 may be disposed over each semiconductor layer SCL and the corresponding gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to each semiconductor layer SCL. For example, the first and second transistor electrodes ET1 and ET2 may be connected to the first and second areas of each semiconductor layer SCL through corresponding contact holes which pass through the gate insulating layer GI and the interlayer insulating layer ILD.

In an embodiment, at least one transistor provided in the pixel circuit PXC may be connected to any one pixel electrode. For example, any one of the first and second transistor electrodes ET1 and ET2 of the first transistor T1 may be electrically connected to the first electrode ELT1 and/or the first connection electrode CNL1 of the light source unit LSU disposed over the passivation layer PSV, through the first contact hole CH1 passing through the passivation layer PSV.

In an embodiment, at least one signal line and/or power line that is connected to each pixel PXL may be disposed on a layer identical with that of one electrode of each of the circuit elements that form the pixel circuit PXC. For example, the second power line PL2 for supplying the voltage of the second power supply VSS may be disposed at a layer identical with that of the gate electrodes GE of the first and second transistors T1 and T2, and electrically connected to the second electrode ELT2 and/or the second connection electrode CNL2 of the light source unit LSU that is disposed on the passivation layer PSV, both through a bridge pattern BRP disposed at the same layer as that of the first and second transistor electrodes ET1 and ET2 and through at least one second contact hole CH2 passing through the passivation layer PSV. However, the structures and/or positions of the second power line PL2, etc. may be changed in various ways.

In an embodiment, the display element layer DPL may include a light source unit LSU of each of the pixels PXL. For example, the display element layer DPL may include at least one first electrode ELT1 and at least one second electrode ELT2, and at least one light emitting diode LD electrically connected between the first and second electrodes ELT1 and ELT2. In some embodiments, the display element layer DPL may further include, e.g., at least one conductive layer and/or insulating layer.

For example, the display element layer DPL may include an insulating pattern INP disposed in each emission area EMA, at least one pair of first and second electrodes ELT1 and ELT2 disposed on the insulating pattern INP, and a plurality of light emitting diodes LD disposed between the first and second electrodes ELT1 and ELT2, and may selectively further include first and second contact electrodes CNE1 and CNE2 disposed, respectively, over the first and second ends EP1 and EP2 of each of the light emitting diodes LD and the first and second electrodes ELT1 and ELT2. Furthermore, the display element layer DPL may include first to third insulating layers INS1, INS2, and INS3 which are successively disposed, and may selectively further include a fourth insulating layer INS4 illustrated in FIG. 8B. Since the structure of the display element layer DPL has been described in detail with reference to FIGS. 6A-9, detailed explanation thereof may not be repeated.

In accordance with embodiments of FIGS. 6A-10, an insulating pattern INP including at least one recess RCS, e.g., a plurality of recesses RCS, is disposed under the first and second electrodes ELT1 and ELT2. At least one light emitting diode LD is disposed in at least one of the recesses RCS. The first end EP1 and the second end EP2 of the light emitting diode LD may be respectively electrically connected to the first electrode ELT1 and the second electrode ELT2. Including the first and second ends EP1 and EP2, the sidewall of the light emitting diode LD may be enclosed or surrounded by the insulating pattern INP and the first and second electrodes ELT1 and ELT2. Hence, the efficiency of light emitted from each emission area EMA may be enhanced.

Because the insulating pattern INP includes the recesses RCS, the light emitting diodes LD may be more intensively disposed in the recess RCS of the insulating pattern INP when the solvent supplied along with the light emitting diodes LD during the process of supplying the light emitting diodes LD to the emission area EMA is removed. Consequently, the light emitting diodes LD may be more easily disposed in a desired area.

In accordance with the embodiments of FIGS. 6A-10, the first and second electrodes ELT1 and ELT2 may include first and second bent portions BP1 and BP2 corresponding to the shape of the insulating pattern INP in an area corresponding to each of the recesses RCS. As such, if the first and second electrodes ELT1 and ELT2 include the first and second bent portions BP1 and BP2, when light emitting diodes LD are supplied to each emission area EMA and an electric field for alignment of the light emitting diodes LD is formed by applying alignment voltages (e.g., set or predetermined alignment voltages) to the first and second electrodes ELT1 and ELT2, the electric field may be significantly focused around the first and second bent portions BP1 and BP2. Consequently, the efficiency of alignment of the light emitting diodes LD may be increased. In other words, in an embodiment of the present disclosure, a larger number of light emitting diodes LD may be more effectively aligned at a desired position. Consequently, the alignment rate of the light emitting diodes LD may be increased.

Figure 11:
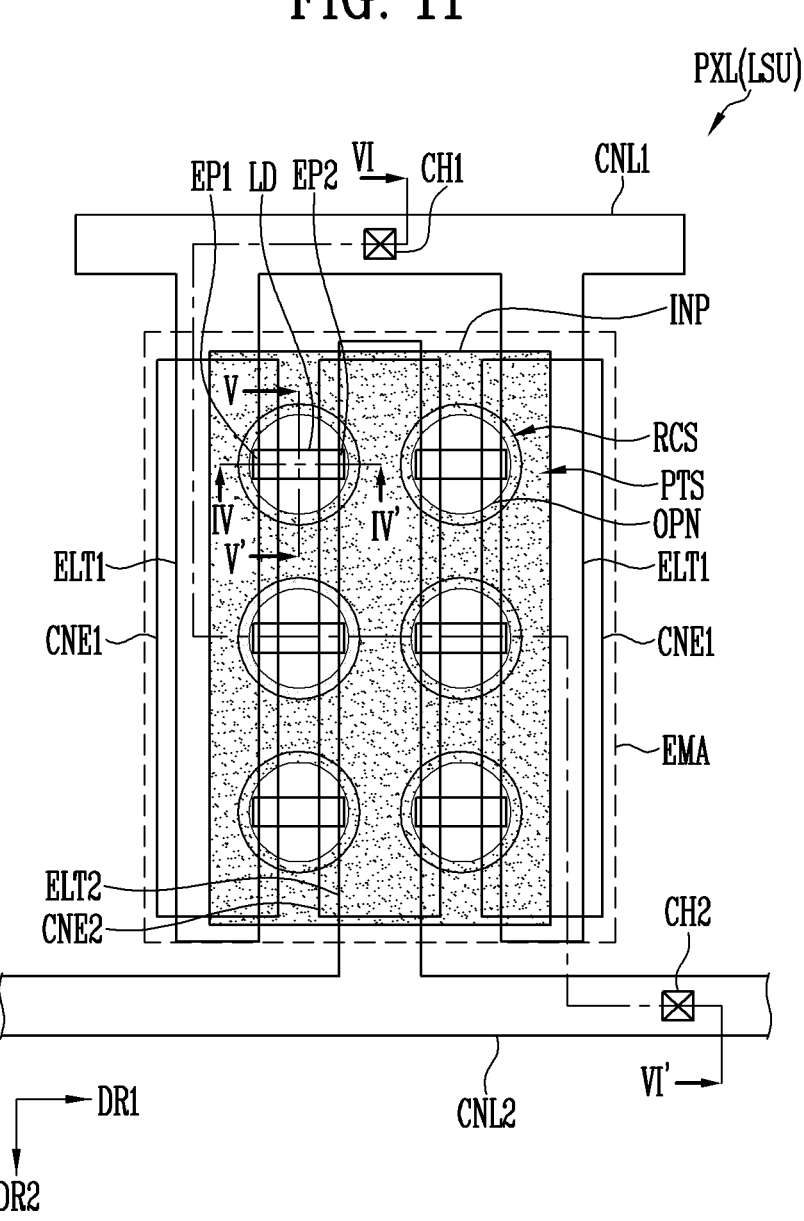
FIG. 11 is a plan view illustrating a light emitting device in accordance with an embodiment of the present disclosure, and for example illustrates an embodiment of a pixel including a light source unit formed of the light emitting device.
Figure 12:
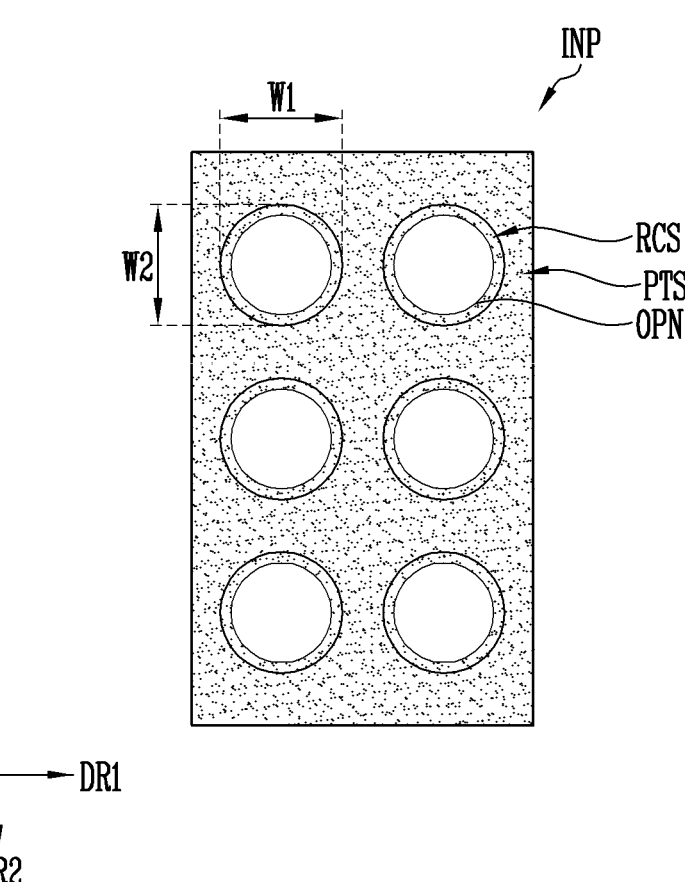
FIG. 12 is a plan view illustrating an insulating pattern in accordance with the embodiment of FIG. 11.
Figure 13A:
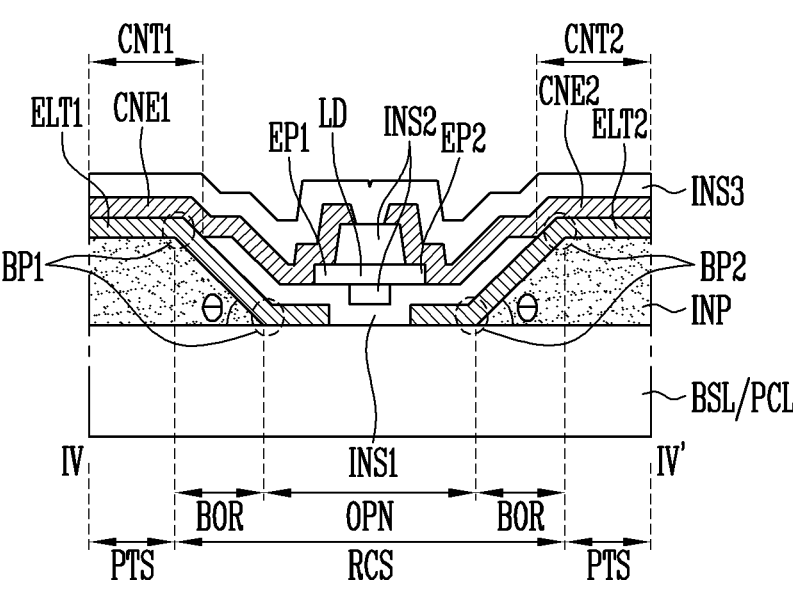
FIGS. 13A and 13B each are a sectional view illustrating a light emitting device in accordance with an embodiment of the present disclosure, and for example illustrate different embodiments of a cross-section corresponding to the line IV-IV' of FIG. 11.
Figure 13B:
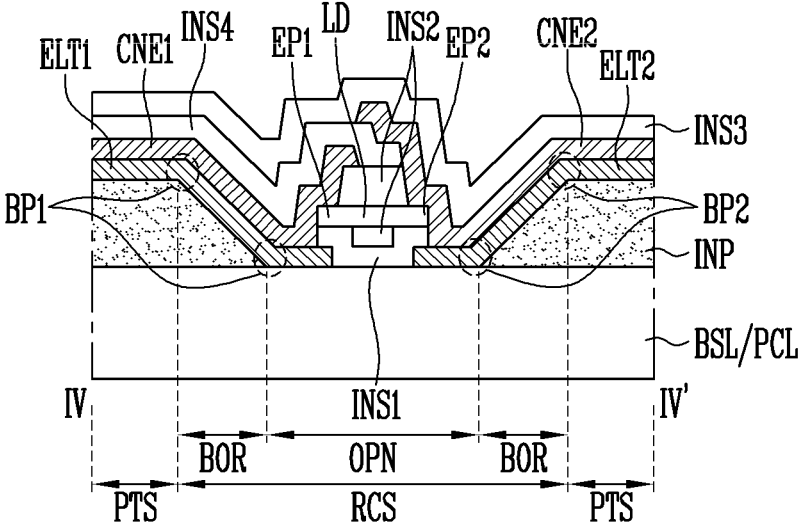
Figure 14:
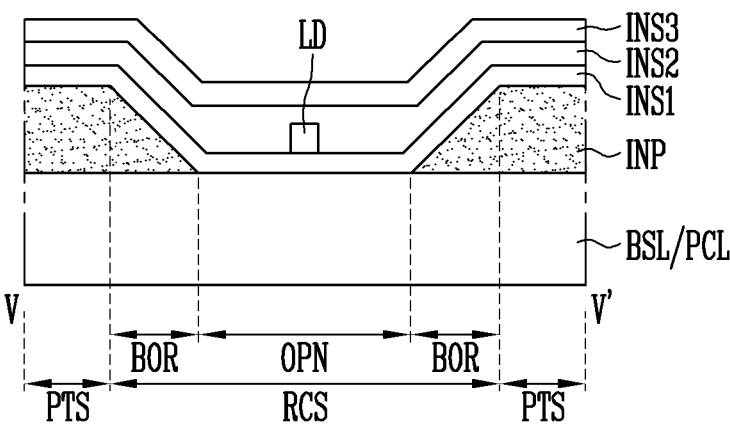
FIG. 14 is a sectional view illustrating a light emitting device in accordance with an embodiment of the present disclosure, and for example illustrates an embodiment of a cross-section corresponding to the line V-V' of FIG. 11.
Figure 15:
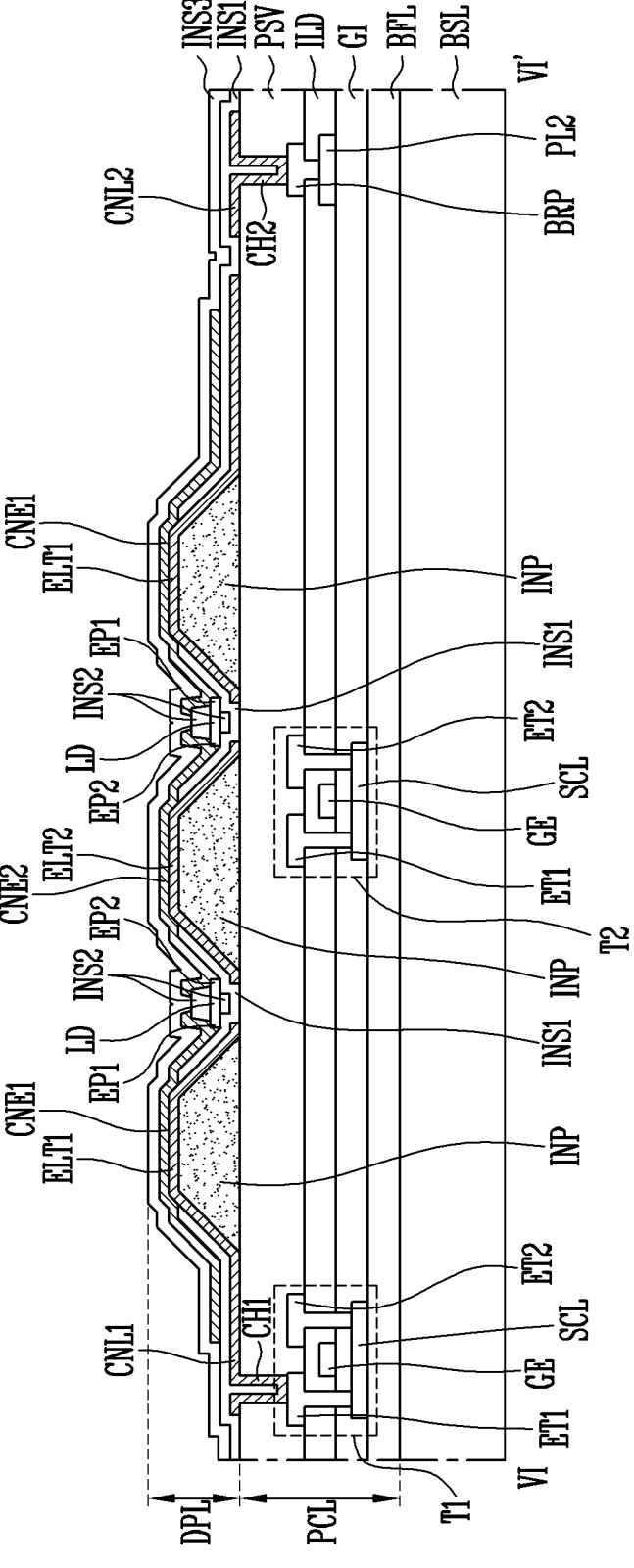
FIG. 15 is a sectional view illustrating a light emitting device in accordance with an embodiment of the present disclosure, and for example illustrates an embodiment of a cross-section corresponding to the line VI-VI' of FIG. 11.

FIG. 11 is a plan view illustrating a light emitting device in accordance with an embodiment of the present disclosure, and for example illustrates an embodiment of a pixel PXL including a light source unit LSU formed of the light emitting device. FIG. 12 is a plan view illustrating an insulating pattern INP in accordance with the embodiment of FIG. 11. FIGS. 13A and 13B each are a sectional view illustrating a light emitting device in accordance with an embodiment of the present disclosure, and for example illustrate different embodiments of a cross-section corresponding to the line IV-IV' of FIG. 11. FIG. 14 is a sectional view illustrating a light emitting device in accordance with an embodiment of the present disclosure, and for example illustrates an embodiment of a cross-section corresponding to the line V-V' of FIG. 11. FIG. 15 is a sectional view illustrating a light emitting device in accordance with an embodiment of the present disclosure, and for example illustrates an embodiment of a cross-section corresponding to the line VI-VI' of FIG. 11. In an embodiment of FIGS. 11-15, like reference numerals are used to designate identical or similar components as those of the embodiments of FIGS. 6A-10, and detailed descriptions thereof will be omitted.

Referring to FIGS. 11-15, the insulating pattern INP may include at least one opening OPN. For example, the insulating pattern INP may include a plurality of openings OPN corresponding to the respective recesses RCS.

For example, each recess RCS in accordance with embodiments of FIGS. 6A-10 may be modified to include the opening OPN, as illustrated in FIGS. 11-15. For example, each recess RCS may include the opening OPN by opening a bottom surface of the recess RCS.

In the foregoing embodiment, the sidewalls of the light emitting diodes LD connected between the first and second electrodes ELT1 and ELT2 may also be enclosed or surrounded by the insulating pattern INP and the first and second electrodes ELT1 and ELT2. Hence, the efficiency of light emitted from each emission area EMA may be enhanced.

Furthermore, because the insulating pattern INP includes the openings OPN corresponding to the recesses RCS, the light emitting diodes LD may be more intensively disposed in each recess RCS, and the efficiency of alignment of the light emitting diodes LD can be further increased. Consequently, the alignment rate of the light emitting diodes LD may be increased.

Figure 16:
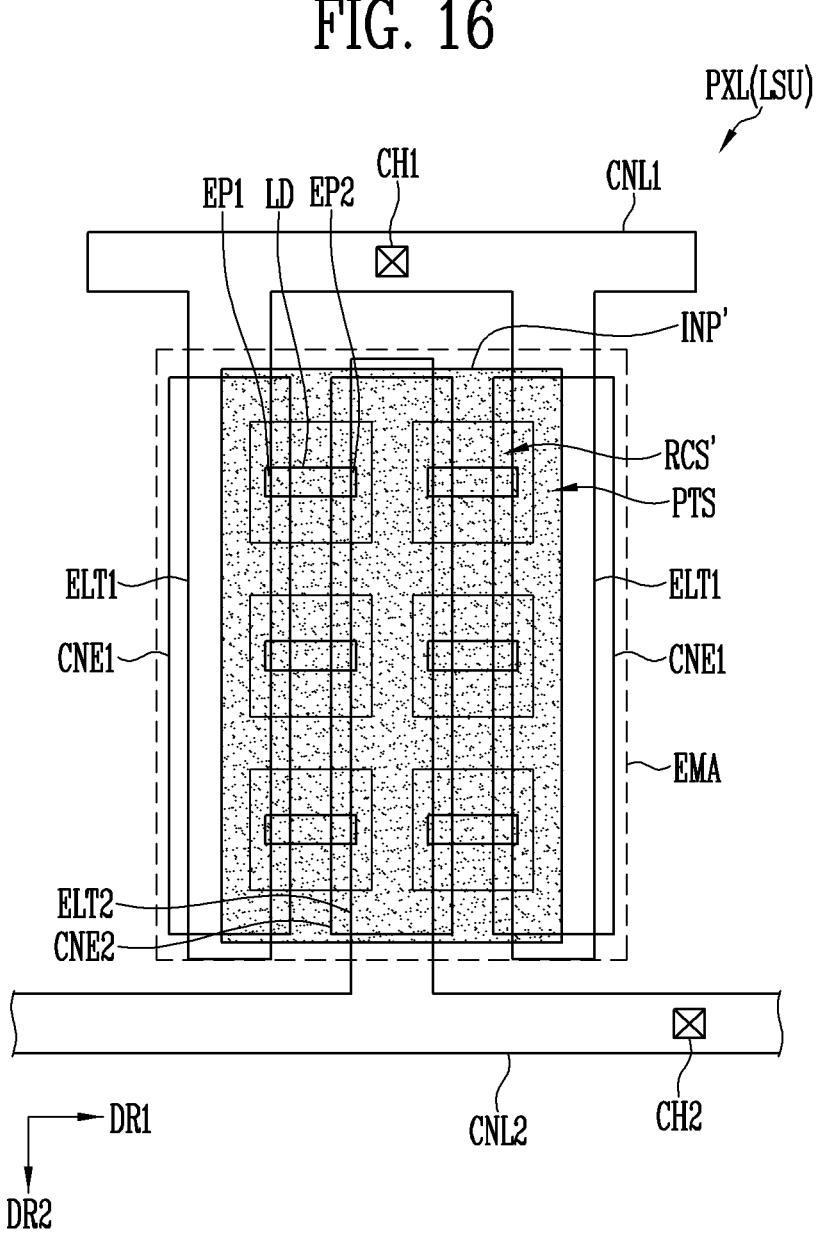
FIG. 16 is a plan view illustrating a light emitting device in accordance with an embodiment of the present disclosure, and for example illustrates an embodiment of a pixel including a light source unit formed of the light emitting device.
Figure 17:
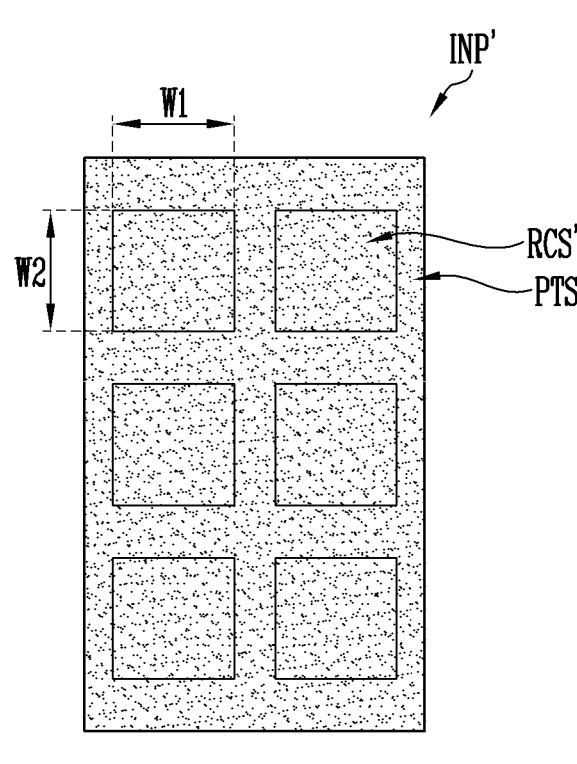
FIG. 17 is a plan view illustrating an insulating pattern in accordance with the embodiment of FIG. 16.
Figure 17:
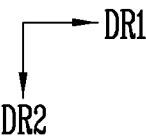
Figure 18:
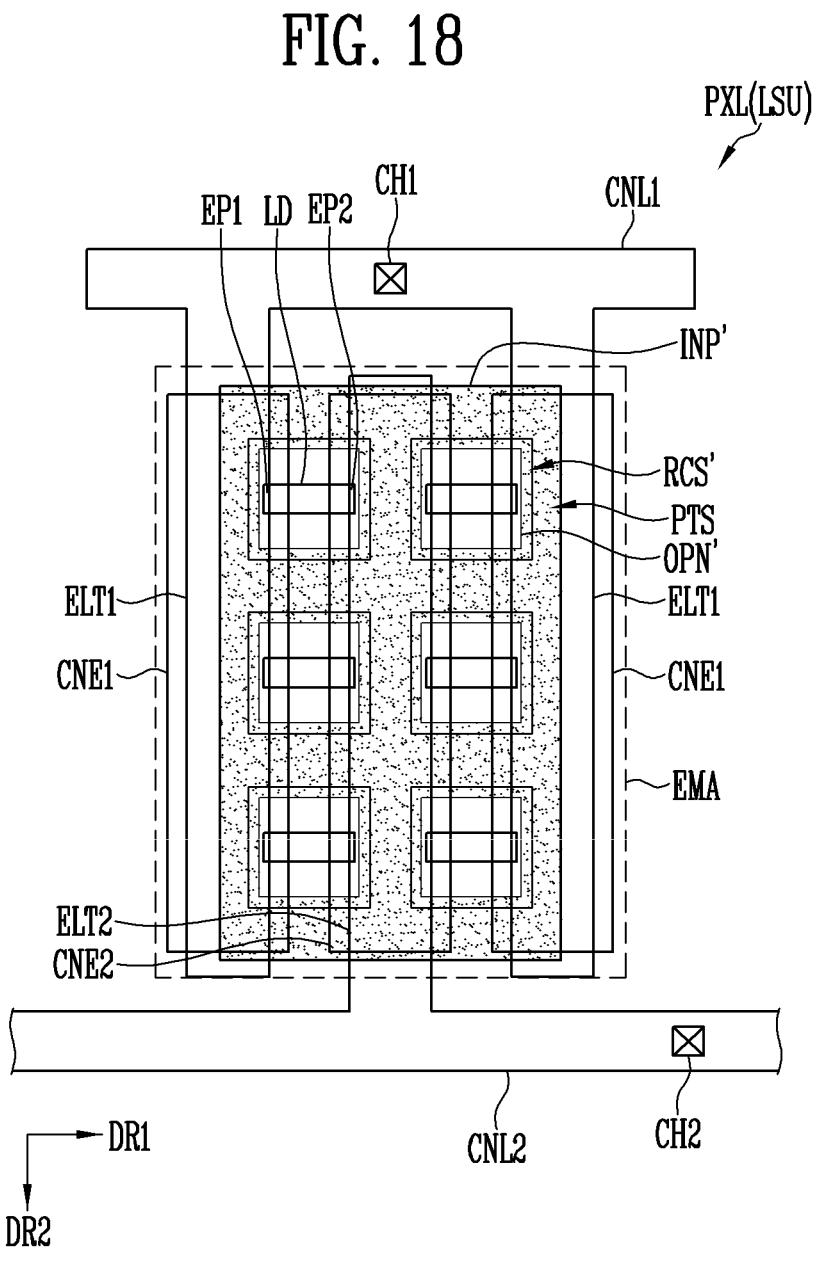
FIG. 18 is a plan view illustrating a light emitting device in accordance with an embodiment of the present disclosure, and for example illustrates a modification pertaining to the insulating pattern of FIGS. 16 and 17.

FIG. 16 is a plan view illustrating a light emitting device in accordance with an embodiment of the present disclosure, and for example illustrates an embodiment of a pixel PXL including a light source unit LSU formed of the light emitting device. FIG. 17 is a plan view illustrating an insulating pattern INP' in accordance with the embodiment of FIG. 16. FIG. 18 is a plan view illustrating a light emitting device in accordance with an embodiment of the present disclosure, and for example illustrates a modification pertaining to the insulating pattern INP' of FIGS. 16 and 17. In the description of the embodiment of FIGS. 16-18, like reference numerals will be used to designate components similar or equal to those of the previous embodiments, and detailed explanation thereof may not be repeated.

Referring to FIGS. 16-18, the insulating pattern INP' may include a rectangular recess RCS'. For example, the insulating pattern INP' may include a plurality of recesses RCS' each having a square shape. In an embodiment, at least one recess RCS' may selectively include an opening OPN'. In an embodiment, each opening OPN' may have a shape corresponding to each recess RCS'. For instance, the opening OPN' may have a size corresponding to each recess RCS' and have a square shape.

Figure 19:
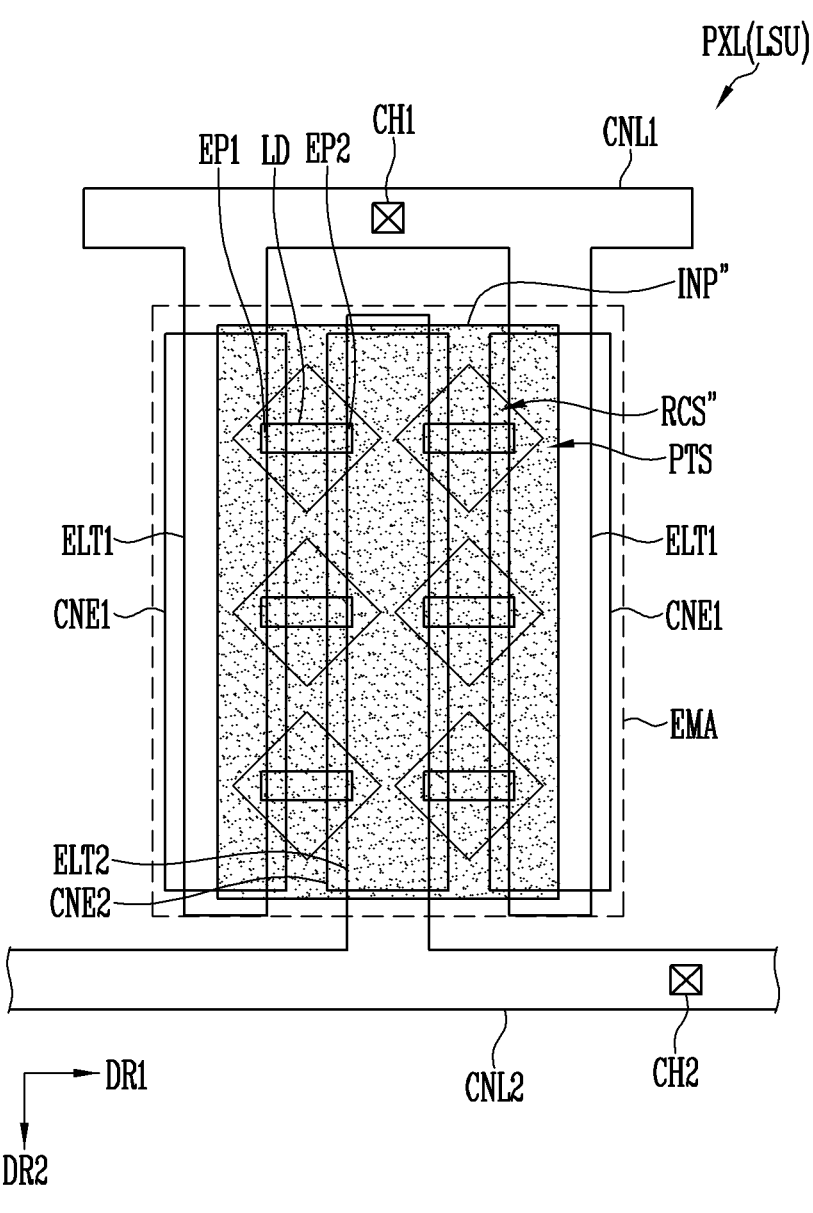
FIG. 19 is a plan view illustrating a light emitting device in accordance with an embodiment of the present disclosure, and for example illustrates an embodiment of a pixel including a light source unit formed of the light emitting device.
Figure 20:
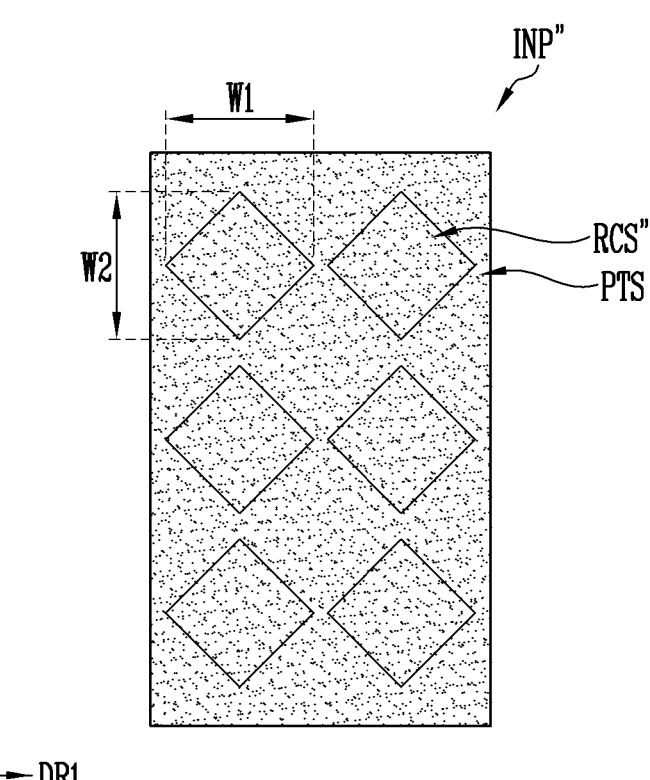
FIG. 20 is a plan view illustrating an insulating pattern in accordance with the embodiment of FIG. 19.
Figure 20:
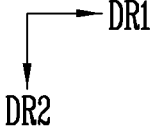
Figure 21:
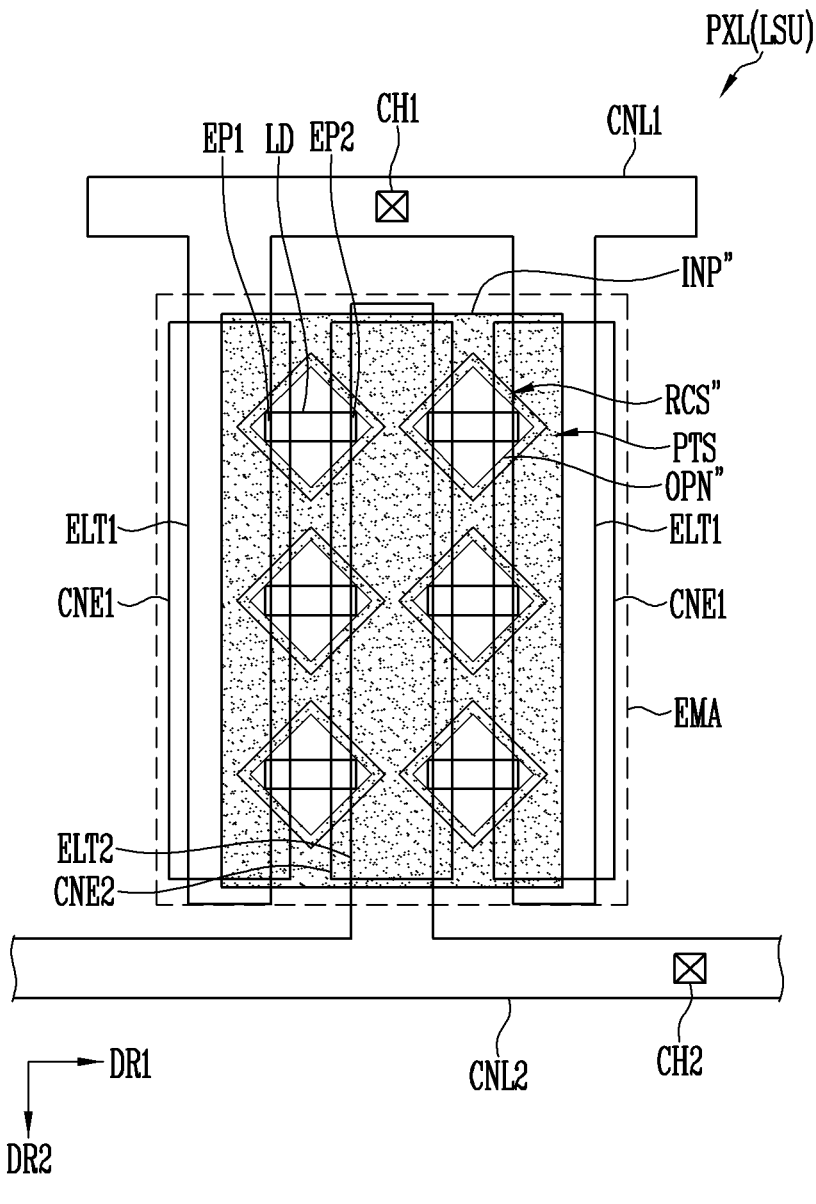
FIG. 21 is a plan view illustrating a light emitting device in accordance with an embodiment of the present disclosure, and for example illustrates a modification pertaining to the insulating pattern of FIGS. 19 and 20.

FIG. 19 is a plan view illustrating a light emitting device in accordance with an embodiment of the present disclosure, and for example illustrates an embodiment of a pixel PXL including a light source unit LSU formed of the light emitting device. FIG. 20 is a plan view illustrating an insulating pattern INP" in accordance with the embodiment of FIG. 19. FIG. 21 is a plan view illustrating a light emitting device in accordance with an embodiment of the present disclosure, and for example illustrates a modification pertaining to the insulating pattern INP" of FIGS. 19 and 20. In the description of the embodiment of FIGS. 19-21, like reference numerals will be used to designate components similar or equal to those of the previous embodiments, and detailed explanation thereof will be omitted.

Referring to FIGS. 19-21, the insulating pattern INP" may include a recess RCS" having a rhombic shape. For example, the insulating pattern INP" may include a plurality of recesses RCS" each having a rhombic shape. In an embodiment, at least one recess RCS" may selectively include an opening OPN". In an embodiment, each opening OPN" may have a shape corresponding to each recess RCS". For instance, the opening OPN" may have a size corresponding to each recess RCS" and have a rhombic shape.

As illustrated in the embodiments of FIGS. 6A-21, the shape of each recess RCS, RCS', RCS" and/or each opening OPN, OPN', OPN" may be changed in various ways. For example, each recess RCS, RCS', RCS" and/or each opening OPN, OPN', OPN" may have a circular shape, a square shape, or a rhombus shape. For example, each recess RCS, RCS', RCS" and/or each opening OPN, OPN', OPN" may have other shapes. For example, in an embodiment of the present disclosure, each recess RCS, RCS', RCS" and/or each opening OPN, OPN', OPN" may have an elliptical shape, or polygonal shapes other than a square shape or a rhombus shape. Alternatively, in an embodiment of the present disclosure, each recess RCS, RCS', RCS" and/or each opening OPN, OPN', OPN" may have a combination of a circular or elliptical shape and a polygonal shape, e.g., a shape including a combination of a linear side and a curved side.

Furthermore, the size of each recess RCS, RCS', RCS" and/or each opening OPN, OPN', OPN" may be changed in various ways. For example, the size of each recess RCS, RCS', RCS" and/or each opening OPN, OPN' OPN" may be changed in various ways depending on the sizes, the structures, etc. of each emission area EMA, the first and second electrodes ELT1 and ELT2, and/or the light emitting diodes LD.

Figure 22:
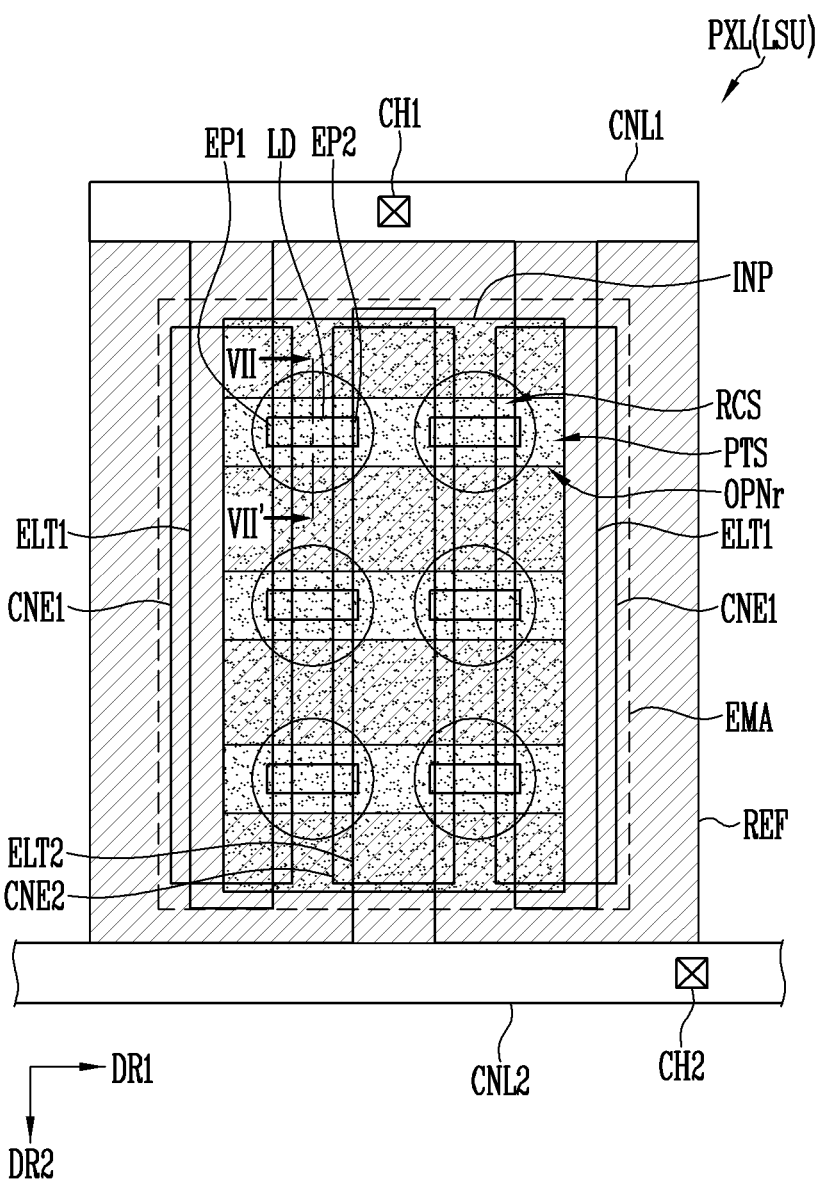
FIG. 22 is a plan view illustrating a light emitting device in accordance with an embodiment of the present disclosure, and for example illustrates an embodiment of a pixel including a light source unit formed of the light emitting device.
Figure 23:
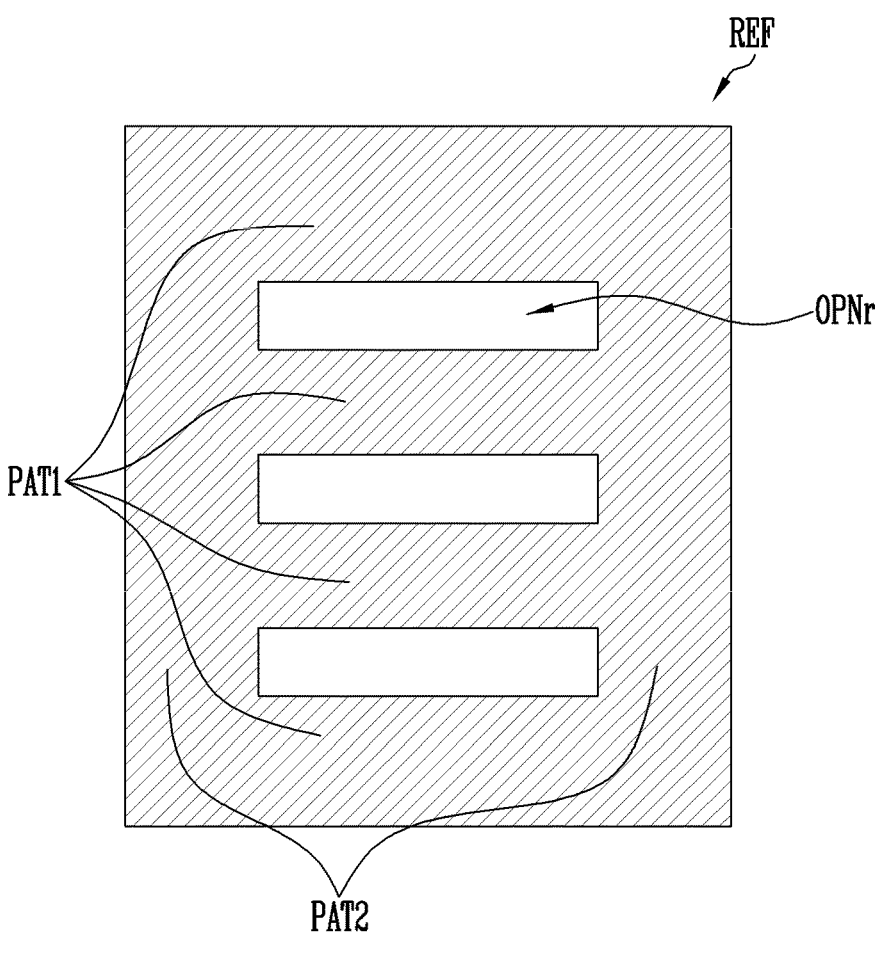
FIG. 23 is a plan view illustrating a reflective electrode in accordance with the embodiment of FIG. 22.
Figure 24:
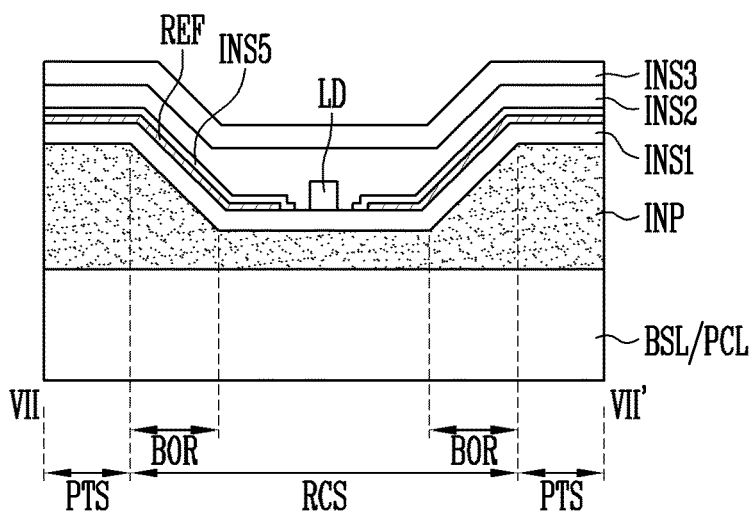
FIG. 24 is a sectional view illustrating a light emitting device in accordance with an embodiment of the present disclosure, and for example illustrates an embodiment of a cross-section corresponding to the line VII-VII' of FIG. 22.

FIG. 22 is a plan view illustrating a light emitting device in accordance with an embodiment of the present disclosure, and for example illustrates an embodiment of a pixel PXL including a light source unit LSU formed of the light emitting device. FIG. 23 is a plan view illustrating a reflective electrode REF in accordance with the embodiment of FIG. 22. FIG. 24 is a sectional view illustrating a light emitting device in accordance with an embodiment of the present disclosure, and for example illustrates an embodiment of a cross-section corresponding to the line VII-VII' of FIG. 22. In the description of the embodiment of FIGS. 22-24, like reference numerals are used to designate components similar or equal to those of the above-described embodiments, e.g., the embodiments of FIGS. 6A-10, and detailed explanation thereof will be omitted.

Referring to FIGS. 22-24, a light emitting device and the pixel PXL including the light emitting device in accordance with embodiments of the present disclosure may further include a reflective electrode (or a reflective pattern layer) REF disposed around the light emitting diodes LD.

In an embodiment, the reflective electrode REF may be disposed on the first insulating layer INS1 at a position adjacent to the light emitting diodes LD, and include an opening OPNr corresponding to the light emitting diodes LD. For example, the reflective electrode REF may include at least one opening OPNr which partially overlaps with at least one recess RCS.

For example, the reflective electrode REF may include at least one first directional pattern PAT1 which extends in a direction intersecting with the first and second electrodes ELT1 and ELT2. For example, the reflective electrode REF may include a plurality of first directional patterns PAT1 which extend in a first direction DR1 perpendicular to the first and second electrodes ELT1 and ELT2 and are disposed in parallel to each other. The reflective electrode REF may include second directional patterns PAT2 which connect the first directional patterns PAT1 to each other. In an embodiment, the first and second directional patterns PAT1 and PAT2 may be integrally connected to each other, but the present disclosure is not limited thereto.

In an embodiment, the reflective electrode REF may be electrically isolated from the first and second electrodes ELT1 and ELT2 and the light emitting diodes LD. To this end, a fifth insulating layer INS5 may be disposed over the reflective electrode REF. The reflective electrode REF may float to remain electrically isolated, and may be connected to a reference power supply (e.g., a set or predetermined reference power supply).

In accordance with the embodiments of FIGS. 22-24, the additional reflective electrode REF is formed around the light emitting diodes LD, so that the reflectivity of light emitted from the light emitting diodes LD may be increased. For example, with respect to the second direction DR2, the reflectivity of light emitted from the light emitting diodes LD may also be increased. Hence, the efficiency of light emitted from each emission area EMA may be further enhanced.

While the scope of the present disclosure are described by detailed embodiments, it should be noted that the above-described embodiments are merely descriptive and should not be considered limiting. It should be understood by those skilled in the art that various changes, substitutions, and alterations may be made herein without departing from the scope of the present disclosure as defined by the claims.

The scope of the present disclosure is not limited by detailed descriptions of the present disclosure, and should be defined by the accompanying claims. Furthermore, all changes or modifications of the present disclosure derived from the meanings and scope of the claims, and equivalents thereof should be construed as being included in the scope of the present disclosure.

The invention claimed is:

1. A light emitting device comprising:
an emission area;
an insulating pattern in the emission area, the insulating pattern comprising at least one recess and a protrusion around the recess;
a first electrode on the insulating pattern and a first area of the recess and the protrusion in a periphery of the first area;
a second electrode on the insulating pattern and spaced in a plan view from the first electrode in a first direction that is perpendicular to a thickness direction of the light emitting device, the second electrode overlapping a second area of the recess and the protrusion in a periphery of the second area, the first electrode and the second electrode being at a same layer;
an insulating layer on the recess and covering the first electrode and the second electrode; and
a light emitting diode over the insulating layer on the recess and electrically connected between the first electrode and the second electrode, p1 wherein the insulating layer is formed to be concave along the recess.

2. The light emitting device according to claim 1, wherein the recess comprises, in a perimeter area thereof adjacent to the protrusion, an inclined surface having an inclination within an angular range.

3. The light emitting device according to claim 2, wherein each of the first electrode and the second electrode comprises a bent portion having a bent shape on each of an upper end and a lower end of the inclined surface.

4. The light emitting device according to claim 1, wherein the recess has a circular shape, an elliptical shape, a polygonal shape, or a combination thereof, in a plan view.

5. The light emitting device according to claim 1, wherein the recess includes an opening.

6. The light emitting device according to claim 1, wherein the recess has a width greater than a length of the light emitting diode in the first direction.

7. The light emitting device according to claim 1, wherein the recess has an identical width in the first direction and a second direction perpendicular to the first direction.

8. The light emitting device according to claim 1, wherein the light emitting diode comprises a rod-type light emitting diode comprising a first end and a second end on opposite ends thereof in a longitudinal direction.

9. The light emitting device according to claim 8, further comprising:

a first contact electrode on the first end of the light emitting diode and one area of the first electrode to electrically connect the first end to the first electrode; and a second contact electrode on the second end of the light emitting diode and one area of the second electrode to electrically connect the second end to the second electrode.

10. The light emitting device according to claim 1, further comprising a reflective electrode on the insulating layer adjacent to the light emitting diode, and including an opening corresponding to the light emitting diode.

11. The light emitting device according to claim 10, wherein each of the first electrode and the second electrode extends in a second direction intersecting with the first direction, and wherein the reflective electrode comprises at least one first directional pattern extending in the first direction and crossing the first electrode and the second electrode.

12. The light emitting device according to claim 1, wherein the insulating pattern comprises a plurality of recesses located at intervals, and wherein at least one light emitting diode is in each of the plurality of recesses.

13. A display device comprising:

a display area; and a pixel in the display area and including an emission area, wherein the pixel comprises:

an insulating pattern in the emission area, the insulating pattern comprising at least one recess and a protrusion around the recess;

a first electrode on the insulating pattern and overlapping a first area of the recess and the protrusion in a periphery of the first area;

a second electrode on the insulating pattern and spaced in a plan view from the first electrode in a first direction that is perpendicular to a thickness direction of the display device, the second electrode overlapping a second area of the recess and the protrusion in a periphery of the second area, the first electrode and the second electrode being at a same layer;

an insulating layer on the recess and covering the first electrode and the second electrode; and a light emitting diode over the insulating layer on the recess and electrically connected between the first electrode and the second electrode, and wherein the insulating layer is formed to be concave along the recess.

14. The display device according to claim 13, wherein the recess comprises, in a perimeter area thereof adjacent to the protrusion, an inclined surface having an inclination within an angular range, and wherein each of the first electrode and the second electrode comprises a bent portion having a bent shape on each of an upper end and a lower end of the inclined surface.

15. The display device according to claim 13, wherein the recess has a circular shape, an elliptical shape, a polygonal shape, or a combination thereof, in a plan view.

16. The display device according to claim 13, wherein the recess includes an opening.

17. The display device according to claim 13, wherein the recess has a width greater than a length of the light emitting diode in the first direction.

18. The display device according to claim 13, wherein the pixel comprises a reflective electrode on the insulating layer adjacent to the light emitting diode, and including an opening corresponding to the light emitting diode.

19. The display device according to claim 13, wherein the insulating pattern comprises a plurality of recesses located at intervals in the emission area, and wherein at least one light emitting diode is in each of the plurality of recesses.

* * * * *